(12) United States Patent
Helander et al.

(10) Patent No.: US 9,484,544 B2
(45) Date of Patent: Nov. 1, 2016

(54) ORGANIC ELECTROLUMINESCENT DEVICE WITH MULTIPLE PHOSPHORESCENT EMITTERS

(71) Applicant: OTI Lumionics Inc., Toronto (CA)

(72) Inventors: Michael Helander, Toronto (CA); Zhibin Wang, Toronto (CA); Jacky Qiu, Toronto (CA); Zhenghong Lu, Toronto (CA)

(73) Assignee: OTI Lumionics Inc., Toronto (CA)

( * ) Notice: Subject to any disclaimer, the term of this patent is extended or adjusted under 35 U.S.C. 154(b) by 0 days.

(21) Appl. No.: 14/418,794

(22) PCT Filed: Jul. 31, 2013

(86) PCT No.: PCT/CA2013/050595
§ 371 (c)(1),
(2) Date: Jan. 30, 2015

(87) PCT Pub. No.: WO2014/019090
PCT Pub. Date: Feb. 6, 2014

(65) Prior Publication Data
US 2015/0214500 A1    Jul. 30, 2015

Related U.S. Application Data

(60) Provisional application No. 61/677,658, filed on Jul. 31, 2012, provisional application No. 61/695,248, filed on Aug. 30, 2012.

(51) Int. Cl.
*H01L 51/50* (2006.01)
*H01L 51/56* (2006.01)

(52) U.S. Cl.
CPC ....... *H01L 51/5024* (2013.01); *H01L 51/5004* (2013.01); *H01L 51/504* (2013.01); *H01L 51/5016* (2013.01); *H01L 51/5036* (2013.01); *H01L 51/56* (2013.01)

(58) Field of Classification Search
CPC ................ H01L 51/504; H01L 51/5024
USPC .................................. 438/35; 257/86
See application file for complete search history.

(56) References Cited

U.S. PATENT DOCUMENTS

| 2002/0197511 | A1 | 12/2002 | D'Andrade et al. |
| 2007/0257600 | A1* | 11/2007 | Matsuura ............ H01L 51/0067 313/498 |
| 2009/0009066 | A1* | 1/2009 | Nishimura ............. C09K 11/06 313/504 |

(Continued)

FOREIGN PATENT DOCUMENTS

| WO | 0215645 A1 | 2/2002 |
| WO | 2009061922 A2 | 5/2009 |

OTHER PUBLICATIONS

Wang, Z. et al.: 'Highly simplified phosphorescent organic light emitting diode with >20% external quantum efficiency at >10,000 cd/m2' Applied Physics Letters vol. 98, Feb. 18, 2011, p. 073310.

(Continued)

*Primary Examiner* — Caridad Everhart
(74) *Attorney, Agent, or Firm* — Blake, Cassels & Graydon LLP; Leah Begleiter Rodin

(57) ABSTRACT

A multiple emitter organic light emitting diode (OLED) is provided. The OLED comprises a host having a triplet energy gap. At least one emitter having a triplet energy gap greater than the triplet energy gap of the host is doped into the host and at least one other emitter having a triplet energy gap less than the triplet energy gap of the host is also doped into the host.

20 Claims, 22 Drawing Sheets

(56) References Cited

U.S. PATENT DOCUMENTS

2012/0091438 A1* 4/2012 Yabunouchi ........... C09K 11/06
                                                    257/40
2014/0001449 A1* 1/2014 Maunoury ........... C07D 209/88
                                                    257/40

OTHER PUBLICATIONS

Grumazescu,Mihai; International Search from corresponding PCT Application No. PCT/CA2013/050595; search completed Oct. 11, 2013.

Hudson, Zachary M. et al.; Highly Efficient Orange Electrophosphorescence from a Trifunctional Organoboron-Pt(II) Complex; Chemical Communications Issue 2, 2011, 47, 755-757.

Swensen, James S. et al.; Improved Efficiency in Blue Phosphorescent Organic Light-Emitting Devices Using Host Materials of Lower Triplet Energy than the Phosphorescent Blue Emitter; Advanced Functional Materials; vol. 21, Issue 17, pp. 3250-3258, Sep. 9, 2011.

* cited by examiner

ORGANIC ELECTROLUMINESCENT DEVICE WITH MULTIPLE PHOSPHORESCENT EMITTERS

CROSS-REFERENCE TO RELATED APPLICATIONS

This application is a U.S. National Stage Filing under 35 U.S.C. 371 from International Application No. PCT/CA2013/050595 filed on Jul. 31, 2013, which claims priority from U.S. Provisional Patent Application No. 61/677,658 filed on Jul. 31, 2012 and U.S. Provisional Patent Application No. 61/695,248 filed on Aug. 30, 2012, the contents of each of which are hereby incorporated by reference in their entirety.

TECHNICAL FIELD

The following relates generally to organic electroluminescent devices with multiple phosphorescent emitters.

BACKGROUND

Organic light emitting diodes (OLEDs) typically comprise several layers of organic material sandwiched between conductive thin film electrodes, at least one of the organic layers being electroluminescent. When a voltage is applied to the electrodes, holes and electrons are injected from the anode and cathode, respectively. The holes and electrons migrate from the electrodes and through the layers of organic material. When a hole and an electron are in close proximity, they are attracted to each other due to an electrostatic Coulomb force. The hole and the electron may combine to form a bound state referred to as an exciton. An exciton may decay though a radiative recombination process or a non-radiative recombination process. Excitons decaying in an electroluminescent material may decay in a radiative recombination process to produce a photon.

A radiative recombination process can occur as fluorescence or as phosphorescence depending on the spin state of the electron and hole combination that formed the exciton. Specifically, the exciton formed by the combination of the hole and electron may be characterized as having a singlet or triplet spin state. Radiative decay of an exciton from a singlet state results in fluorescence, whereas radiative decay from a triplet state results in phosphorescence.

Approximately one quarter of the excitons formed in organic materials typically used in OLEDs are singlets with the remaining three quarters being triplets. Direct radiative decay from a triplet state to a singlet state is an inhibited or forbidden transition in quantum mechanics and, as such, the probability for radiative decay from a triplet state to a singlet state is generally very small. Unfortunately, the ground state of most organic materials used in OLEDs is a singlet state, which prevents radiative recombination of an exciton in the triplet state directly to a singlet ground state at ambient temperatures. Electroluminescence by fluorescence therefore typically dominates, resulting in a maximum quantum efficiency, defined as the efficiency of electrons and holes recombining to emit light, of about 25%.

Although direct radiative recombination from a triplet state occurs at an extremely slow rate in most organic materials, the recombination rate may be substantially increased by using species with a high spin-orbit coupling constant. For example, complexes of transition elements such as Ir(III) and Pt(III) have been employed in so-called phosphorescent OLEDs, as the high spin-orbit coupling constants of these species promote efficient radiative relaxation from a triplet state. As such, some or all of the approximately 75% of excitons in the triplet state may also transition efficiently to the singlet ground state and emit light.

Advantageously, these species also have a high intersystem crossing rate, allowing most of the singlet states to convert to triplet states and radiatively recombine. As such, both singlet and triplet excitons undergo radiative decay, resulting in a maximum theoretical quantum efficiency of 100%. The practical advantages of enabling both singlet and triplet excitons to undergo radiative decay to the singlet ground state are substantial. For example, phosphorescent OLEDs have now been shown to have superior device efficiencies when compared to fluorescent OLEDs.

In most phosphorescent OLEDs, the emissive layer is comprised of a phosphorescent emitter doped in a host material. Doping a host material to form an emitter limits concentration quenching by isolating emitting sites from one another, and serves to optimize the balance of electrons and holes in the device.

Host materials are chosen, as a design rule, to have a triplet energy gap that is greater than that of the phosphorescent dopant to prevent back energy transfer to the host and to confine triplet excitons within the emissive layer. There has therefore been a strong focus over the last decade to develop host materials with high triplet energy gap for phosphorescent blue and white OLEDs, where triplet energy gaps larger than 2.8 eV are typically required. Experimental evidence over the last decade has confirmed this requirement for phosphorescent OLEDs of various emission colours, and for a large variety of host and phosphorescent emitter combinations.

High triplet energy gap host materials are particularly important in devices having more than one emissive layer. For example, in devices having a blue phosphorescent emitter as well as one or more phosphorescent emitters with a lower triplet energy gap, such as a green or red phosphorescent emitter, a host with a triplet energy gap greater than that of the blue emitter is required. An example of a device that combines, in the same host material, blue, green, and red phosphorescent emitters is a white OLED. White OLEDs use the principle of additive color mixing to produce a white light. Specifically, white OLEDs are designed to emit a combination of blue, green, and red light such that the emitted light stimulates the three types of color sensitive cone cells in a human eye equally and, as such, minimizes hue. For example, a white OLED may be designed to mimic the white color of sun's emission spectrum. As explained above, it is commonly understood that high efficiencies may only be obtained when the triplet energy gap of the host material is higher than that of the phosphorescent emitter with the highest triplet energy gap, which, for a white OLED, would be the blue emitter.

Although hosts with high triplet energy gaps have been developed for use in blue and white phosphorescent OLEDs, these hosts are often lacking in other material parameters that affect device performance, including external quantum efficiency, drive voltage, and/or lifetime. As such, devices requiring a host material with a triplet energy gap greater than that of a blue phosphorescent dopant may suffer compared to devices requiring a host material of a relatively lower triplet energy gap.

SUMMARY

A multiple emitter organic light emitting diode (OLED) is provided and it includes a host having a triplet energy gap, at least one emitter doped into the host having a triplet energy gap greater than the triplet energy gap of the host, and at least one other emitter doped into the host having a triplet energy gap less than the triplet energy gap of the host.

A method is provided for producing a multiple emitter organic light emitting diode (OLED), the method comprising doping an emitter into a host, the emitter having a triplet energy gap greater than a triplet energy gap of the host, and doping an other emitter into the host, the other emitter having a triplet energy gap less than the triplet energy gap of the host.

BRIEF DESCRIPTION OF THE DRAWINGS

Embodiments will now be described by way of example only with reference to the appended drawings wherein.

DETAILED DESCRIPTION

Figure 1:
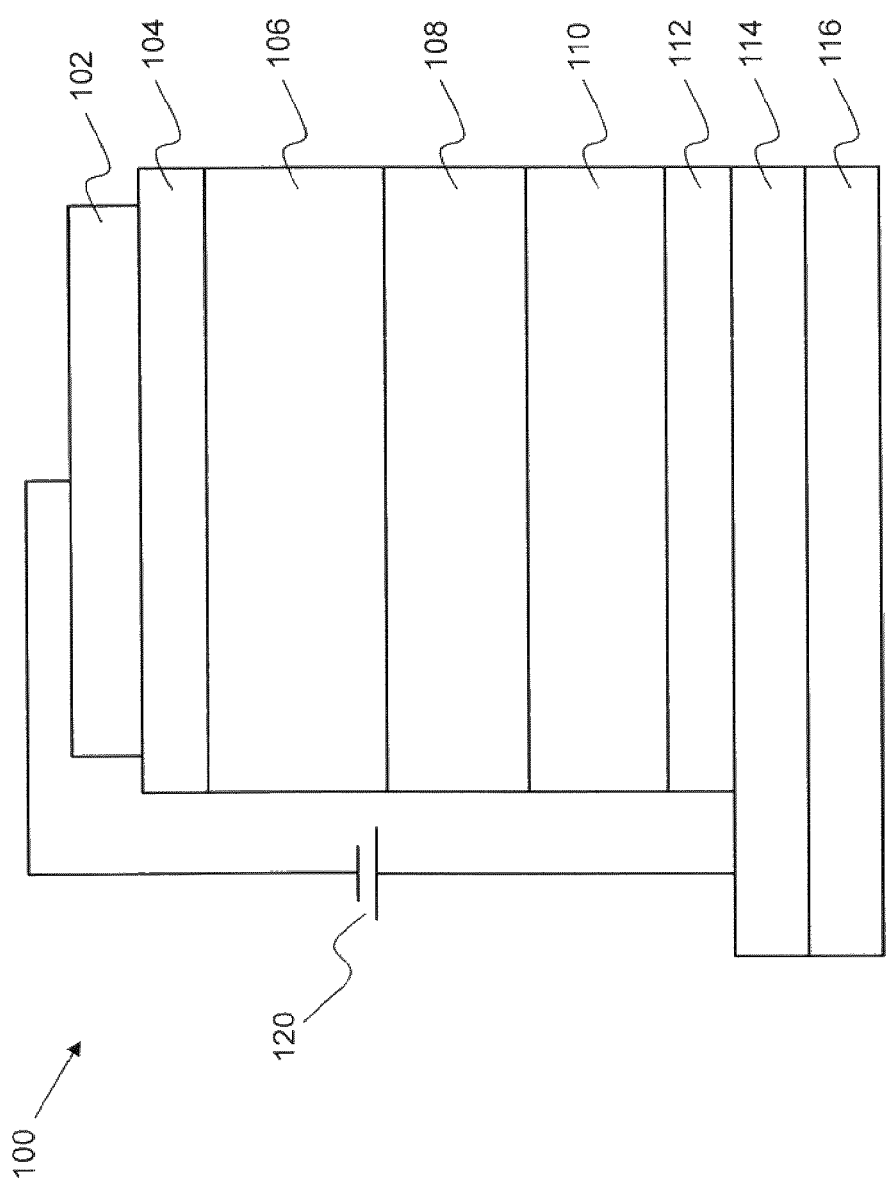
FIG. 1 is a device structure diagram of an example blue phosphorescent OLED construction comprising a SimCP host.

It will be appreciated that for simplicity and clarity of illustration, where considered appropriate, reference numerals may be repeated among the figures to indicate corresponding or analogous elements. In addition, numerous specific details are set forth in order to provide a thorough understanding of the example embodiments described herein. However, it will be understood by those of ordinary skill in the art that the example embodiments described herein may be practiced without these specific details. In other instances, well-known methods, procedures and components have not been described in detail so as not to obscure the example embodiments described herein.

Also, the description is not to be considered as limiting the scope of the example embodiments described herein. For example, reference is made to white OLEDs comprising red, green and blue emissive subunits. It will be appreciated that other combinations of emissive colours to generate white, for example blue and orange, may be constructed using the method described herein. OLEDs with other emissive colours using multiple phosphorescent emitters, for example red and green, may also be constructed using the method described herein.

Provided herein is a phosphorescent OLED with multiple phosphorescent emitters doped into a host material. The triplet energy gap of the host material is lower than that of one or more of the phosphorescent emitters doped into the host but greater than one or more other phosphorescent emitters doped into the host.

Also provided is a method of constructing the phosphorescent OLED comprising multiple phosphorescent emitters doped into a host material, wherein the triplet energy gap of the host material is lower than that of one or more of the phosphorescent emitters doped into the host but greater than one or more other phosphorescent emitters doped into the host.

Further provided is a white phosphorescent OLED with multiple phosphorescent emitters, wherein the triplet energy gap of the host material is lower than that of one or more of the phosphorescent emitters. For example, in a white phosphorescent OLED comprising a blue emitter, a green emitter, and a red emitter, the triplet energy gap of the host material may be lower than that of the blue emitter but higher than that of the green emitter.

Advantageously, because the host material of an OLED with multiple phosphorescent emitters may be at a lower triplet energy gap than the highest energy phosphorescent emitter, fewer compromises are needed with respect to other material parameters that affect device performance. In particular, materials with a higher triplet energy gap typically also have a higher transport gap, which is defined as the gap between the highest occupied molecular orbital (HOMO) and the lowest unoccupied molecular orbital (LUMO) of the material. As such, these materials behave more similarly to insulators and thus exhibit a lower mobility and higher resistivity than emitters with a lower triplet energy gap.

Various methods of determining a triplet energy gap exist. Currently known and future known methods for determining a triplet energy gap that can be used to confirm at least one emitter doped into the host having a triplet energy gap greater than the triplet energy gap of the host, and at least one other emitter doped into the host having a triplet energy gap less than the triplet energy gap of the host can be applied to the principles described herein.

An example method for determining a triplet energy gap, as applied to the proposed example OLED devices, is described below.

The organic material of interest is measured by a known phosphorescence measurement method to obtain the phosphorescence emission spectrum. By way of example, the organic material may be deposited as a thin film on a quartz substrate. Since the phosphorescent emission from many organic materials may be too weak to accurately measure at room temperature, the substrate may be cooled to a cryogenic temperature, for example, the boiling point of nitrogen, 77 K, or the boiling point of helium, 4 K. The resulting phosphorescent emission is measured with respect to wavelength. Specifically, a plot of the phosphorescence spectrum is generated in which the vertical axis represents the phosphorescence intensity and the horizontal axis represents the wavelength. A tangent line is drawn to the rise of the phosphorescence spectrum on the shorter wavelength side. A wavelength value, $\lambda_{edge}$ is defined as the wavelength, in nm, at the intersection of the tangent line and the horizontal axis. The wavelength is then converted into an energy value, which was taken as the triplet energy gap according to the expression: $Eg^T(eV)=1239.85/\lambda_{edge}$, wherein $Eg^T$ is the triplet energy gap in electron volts.

It will be appreciated that although the aforementioned method of defining the triplet energy gap was used, other methods which yield similar or identical values for the triplet energy gap may be used. Also, for organic materials such as phosphorescent emitters that may undergo aggregation and concentration quenching in the solid state, the organic material may be dispersed in an inert host material to measure the triplet energy gap. For example, a phosphorescent emitter may be dispersed in a thin film of polycarbonate.

In monochrome phosphorescent OLEDs with a single emitter back energy transfer to the host and poor confinement of excitons within the emissive layer are detrimental to the overall device efficiency since these processes correspond to effectively lost energy and excitons. Therefore, in monochrome OLEDs, a host with higher triplet energy gap than the emitter is required to confine excitons within the emissive layer and to prevent back energy transfer to the host in order to achieve high device efficiencies. However, in the case of OLEDs with multiple emitters doped into the host, for example, white OLEDs, back energy transfer to the host or poor confinement of excitons within the highest triplet energy gap emissive layer is not necessarily detrimental to the device performance. This is because excitons that were not confined to a higher triplet energy gap emitter may still be captured by one or more of the other, lower energy emitters in the OLED. For example, in a white OLED comprising a blue emitter, a green emitter, and a red emitter, excitons that transfer back from the blue emitter to the host may be captured and relaxed in either the green emitter or the red emitter.

Various example OLED devices were fabricated according to two standard procedures. A first standard device structure was used for OLEDs comprising a single phosphorescent blue emitter. A second standard device structure was used for OLEDs comprising a plurality of emitters, specifically, a blue, a green, and a red phosphorescent emitter. Each of the devices were fabricated in a Kurt J. Lesker LUMINOS® cluster tool on commercially patterned indium tin oxide (ITO) coated glass (50×50 mm$^2$) with a sheet resistance less than 15 Ω/□.

4,4'-Bis(N-carbazolyl)-1,1'-biphenyl (CBP) and 9,9'-(5-(triphenylsilyl)-1,3-phenylene)bis(9H-carbazole) (SimCP) are used as hosts in the following examples. CBP and SimCP were selected as examples due to their comparable energy levels of the highest occupied molecular orbital (HOMO) and the lowest unoccupied molecular orbital (LUMO) as well as similar charge carrier mobilities. 1,3,5-tris-(N-phenylbenzimidazole-2-yl)-benzene (TPBi) is used as an electron transport material. Bis(3,5-difluoro-2-(2-pyridyl)phenyl-(2-carboxypyridyl)iridum(III) (FIrpic) is used as a blue phosphorescent dopant, bis(2-phenylpyridine)(acetylacetonate)iridium(III) (Ir(ppy)$_2$(acac)) is used as a green phosphorescent dopant and bis(2-methyldibenzo[f,h]quinoxaline)(acetylacetonate)iridium(III) (Ir(MDQ)$_2$(acac)) is used as a red phosphorescent dopant. Indium doped tin oxide is used as the transparent conducting anode. Lithium fluoride (LiF) is used as an electron injecting layer and molybdenum oxide (MoO$_3$) is used as a hole injection layer. Aluminum is used as the cathode.

The first standard device structure comprising a single phosphorescent blue emitter is fabricated in layers as follows: ITO/MoO$_3$ (1 nm)/CBP (35 nm)/Host:FIrpic (7.5 nm, 8 or 20 wt %)/TPBi (65 nm)/LiF (1 nm)/Al (100 nm), wherein the host comprises either CBP or SimCP. Specifically, the host may be doped with either 8% or 20% FIrpic, as is further described below. However, it will be understood that other dopant concentrations may also be used.

The second standard device structure comprising blue, green, and red phosphorescent emitters to produce a white OLED is layered as follows: ITO/MoO$_3$ (1 nm)/CBP (35 nm)/Host:Ir(MDQ)$_2$(acac):Ir(ppy)$_2$(acac) (12 nm, 6 wt %, 6 wt %)/Host:Ir(ppy)$_2$(acac) (2 nm, 8 wt %)/Host:FIrpic (7.5 nm, 8 or 20 wt %)/TPBi (65 nm)/LiF (1 nm)/Al (100 nm), wherein the host comprises either CBP or SimCP. Similarly to the blue phosphorescent device, the host may be doped with either 8% or 20% FIrpic, as is further described below. However, it will be understood that other dopant concentrations may also be used.

Each layer of the standard device structures was deposited by physical vapour deposition under vacuum.

The thickness of each of the above layers was measured using a quartz crystal microbalance (QCM) calibrated by spectroscopic ellipsometry (Sopra GES 5E), and the active area of each device was 1×2 mm$^2$. Current-voltage (IV) characteristics were measured using an HP4140B pA meter and luminance-voltage (LV) characteristics were measured using a Minolta LS-110 Luminance meter. The electroluminescence (EL) spectra and spectral radiant power for calculating the external quantum efficiency (EQE) and power efficiency were measured using an integrating sphere and Ocean Optics USB4000 spectrometer calibrated with a NIST traceable halogen lamp.

Table 1 (below) provides values for the triplet energy gap, the highest occupied molecular orbital (HOMO), and the lowest unoccupied molecular orbital (LUMO) of each of the organic materials used in the device construction.

TABLE 1

OLED Materials and Associated Energy Levels

| Material | Triplet Energy (eV) | HOMO (eV) | LUMO (eV) |
|---|---|---|---|
| CBP | 2.6 | 6.1 | 2.8 |
| SimCP | 3.0 | 6.1 | 2.8 |
| TPBi | 2.75 | 6.2 | 2.7 |
| Flrpic | 2.7 | 5.8 | 3.0 |
| Ir(ppy)$_2$(acac) | 2.35 | 5.6 | 3.2 |
| Ir(MDQ)$_2$(acac) | 2.0 | 5.35 | 3.3 |

As is evident from Table 1, CBP has a triplet energy gap of 2.6 eV whereas SimCP has a triplet energy gap of 3.0 eV. Flrpic has a triplet energy gap of 2.7 eV, which is greater than that of CBP but less than that of SimCP. Ir(ppy)$_2$(acac) and Ir(MDQ)$_2$(acac), green and red emitters, respectively, have triplet energy gaps of 2.35 eV and 2.0 eV, respectively, which is significantly less than the triplet energy gap of either the CBP or the SimCP hosts. As such, a host comprising SimCP has a higher triplet energy gap than all of the phosphorescent emitters doped therein. However, a host comprising CBP has a lower triplet energy gap than the blue emitter Flrpic but a higher triplet energy gap than either of the green or red emitters, Ir(ppy)$_2$(acac) and Ir(MDQ)$_2$(acac).

Each of CBP and SimCP have identical carbazole functional groups comprising a pair of benzene rings bonded to a nitrogen atom, as is shown below in FIG. 20. As this functional group provides much of the electronic character to each of these host materials, these materials have similar electronic properties. It will be appreciated that although examples are given using CBP or SimCP as hosts, these materials were selected due to their similar properties and other host materials may provide, for example, higher efficiency, longer lifetime, lower turn on voltage, better manufacturing and processing properties. Because CBP and SimCP are similar in most electronic properties with the major exception of the triplet energy gap, they are good candidate materials to illustrate the effect of using a host with a triplet energy gap that is lower, or higher, than the highest triplet energy gap emitter in an OLED.

It will also be appreciated that although CBP has a triplet energy gap that is approximately 0.1 eV lower than that of the Flrpic emitter, host materials having a triplet energy gap that is between 0 eV and 0.3 eV lower than the triplet energy gap of the highest triplet energy gap emitter may be used.

It will be appreciated that various other host materials may be used. By way of example, various host materials for phosphorescent OLEDs are reviewed in L. Xiao et al., Adv. Mater. 23, 926 (2011).

EXAMPLE 1

Blue emitting phosphorescent OLED devices 100, as exemplified in FIG. 1, were constructed according to the following procedure. A transparent conducting anode of ITO 114 coated on a glass substrate 116 was ultrasonically cleaned with a standard regiment of Alconox™ dissolved in deionized (DI) water, DI water, acetone, and methanol. The ITO anode 114 was then subjected to a UV ozone treatment for 15 minutes in a PL16-110 Photo Surface Processing Chamber (Sen Lights). A 1 nm-thick high work function MoO$_3$ layer 112 was then deposited on the ITO anode 114.

A 35 nm-thick CBP hole transporting layer (HTL) 110 was then deposited on the MoO$_3$ layer 112. A 7.5 nm-thick blue emissive layer of SimCP host doped with the phosphorescent blue emitter Flrpic 108 was deposited on the CBP layer 110. The SimCP host was doped with Flrpic to a concentration of 20 wt %.

A 65 nm-thick TPBi electron transporting layer (ETL) 106 was deposited on the blue phosphorescent emissive SimCP layer 108. A 1 nm-thick LiF layer 104 was deposited on the TPBi layer 106. Finally, a 100 nm-thick Al cathode layer 102 was deposited on the LiF layer. The OLED 100 was driven by a power source 120.

Figure 2:
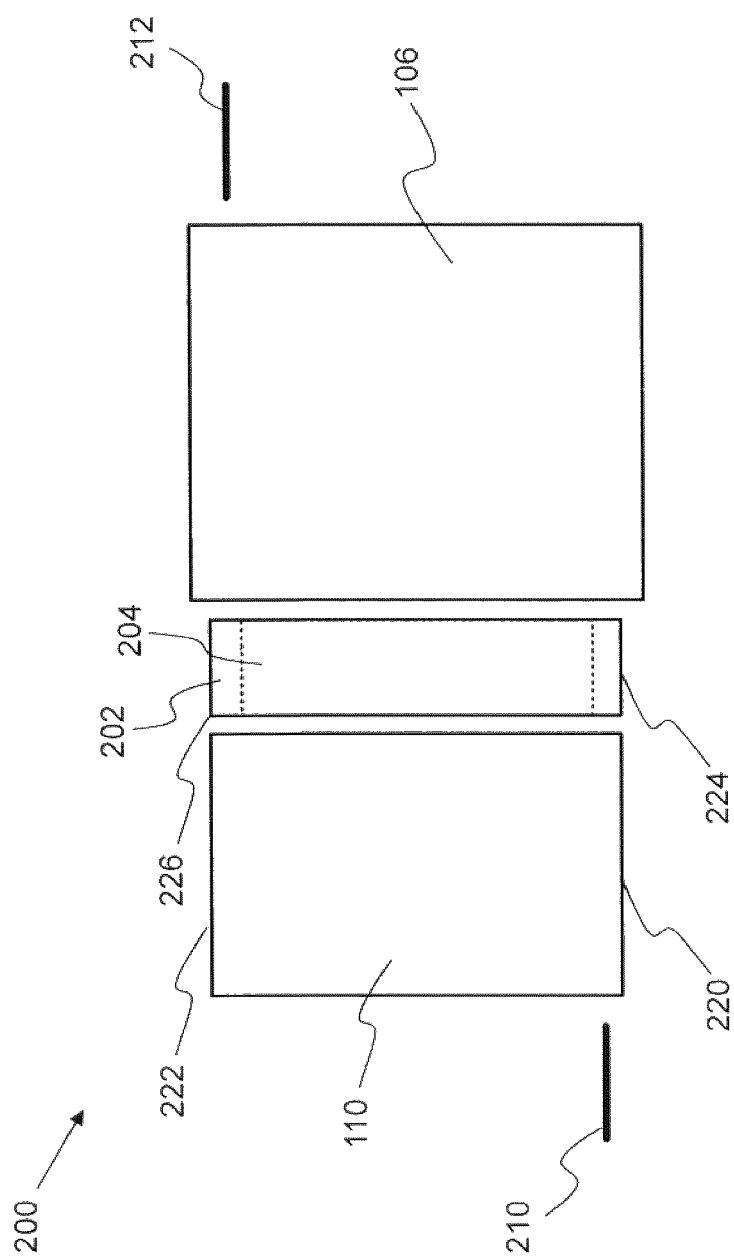
FIG. 2 is an energy level diagram of the example blue phosphorescent OLED construction of FIG. 1.

An energy level diagram 200 of the OLED 100 of FIG. 1 is provided in FIG. 2. Holes are injected from the anode 210 and transported through the CBP layer 110. Similarly, electrons are injected from the cathode 212 and are transported through the TPBi layer 106 to reach the Flrpic emitter 204 in the SimCP host 202. Excitons in the emitter 204 may transition to a relaxed state and emit a photon, which may then escape the OLED device though the anode 210.

Importantly, the Flrpic blue phosphorescent emitter 204 has a lower triplet energy gap than that of the SimCP host 202, as is typical for an OLED device. As will be appreciated from the energy level diagram 200, the HOMO 220 and LUMO 222 levels of the CBP are comparable to those of the SimCP, 224 and 226, respectively.

EXAMPLE 2

A similar device to that exemplified in FIG. 1 and FIG. 2 was produced employing the procedures and materials described in Example 1, however, the blue phosphorescent emissive layer of Flrpic was doped into the SimCP host at a concentration of 8 wt %, rather than the 20 wt % used in Example 1. FIG. 1 and FIG. 2 may similarly be used to describe the device of Example 2.

EXAMPLE 3

The OLED of example 3 is similar to the OLED of Example 1, however, a CBP host, which has a lower triplet energy gap than the Flrpic blue phosphorescent emitter, is used rather than the SimCP host used in Example 1. Similar to the procedure used in Example 1, Blue emitting phosphorescent OLED devices 300, as exemplified in FIG. 3, were constructed according to the following.

A transparent conducting anode of ITO 114 coated on a glass substrate 116 was ultrasonically cleaned with a standard regimen of Alconox™ dissolved in deionized (DI) water, acetone, and methanol. The ITO anode 114 was then subjected to a UV ozone treatment for 15 minutes in a PL16-110 Photo Surface Processing Chamber (Sen Lights). A 1 nm-thick high work function MoO$_3$ layer 112 was then deposited on the ITO anode 114.

A 35 nm-thick CBP hole transporting layer (HTL) 110 was then deposited on the MoO$_3$ layer 112. A 7.5 nm-thick blue emissive layer of CBP host doped with the phosphorescent blue emitter Flrpic 308 was deposited on the CBP layer. The CBP host was doped with Flrpic to a concentration of 20 wt %.

A 65 nm-thick TPBi electron transporting layer (ETL) 106 was deposited on the blue phosphorescent emissive CBP layer. A 1 nm-thick LiF layer 104 was deposited on the TPBi layer 106. Finally, a 100 nm-thick Al cathode layer 102 was deposited on the LiF layer. The OLED 300 was driven by a power source 120.

Figure 3:
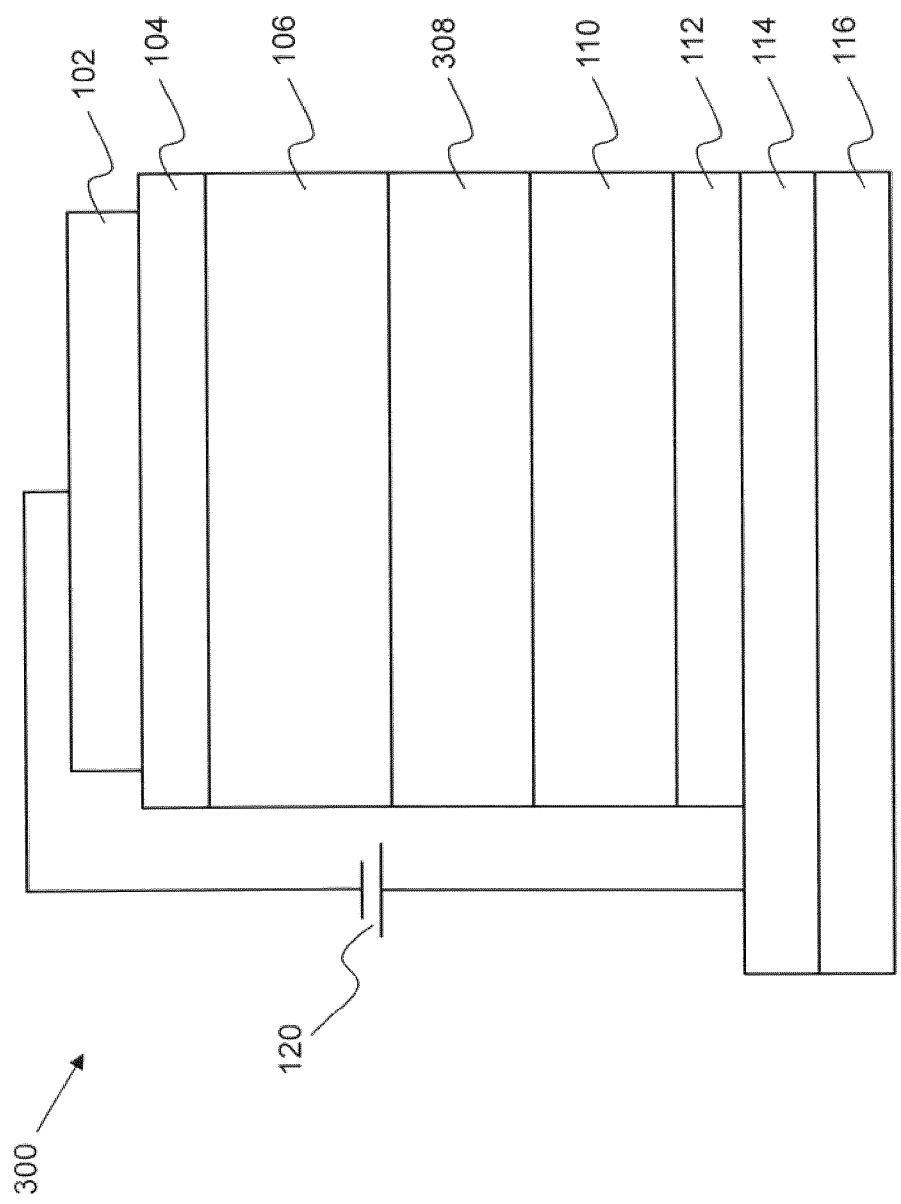
FIG. 3 is a device structure diagram of an example blue phosphorescent OLED construction comprising a CBP host.
Figure 4:
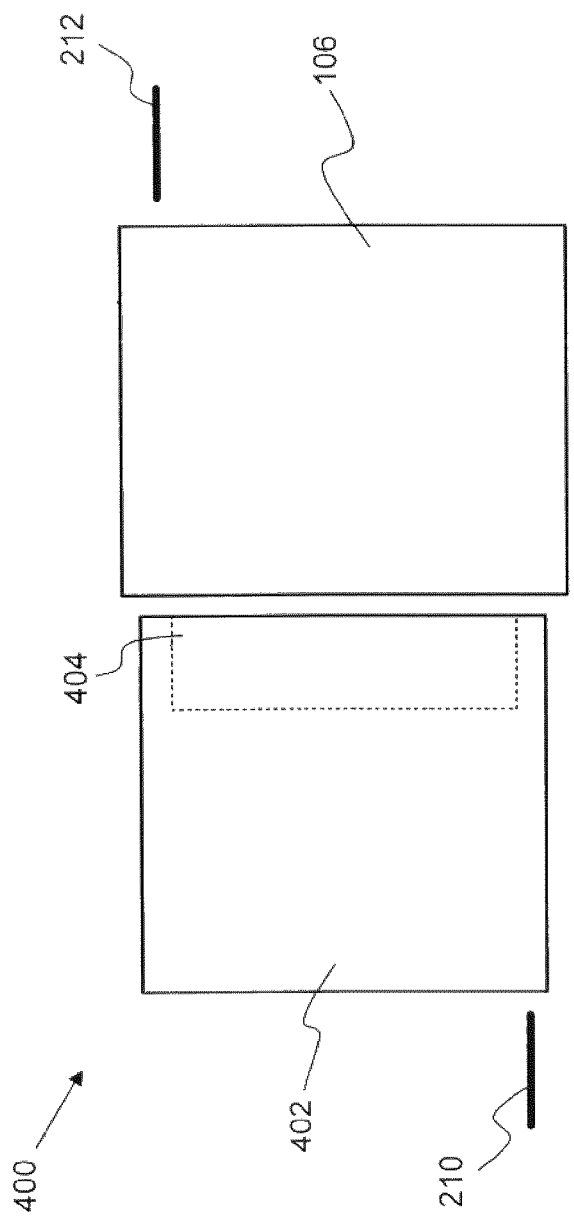
FIG. 4 is an energy level diagram of the example blue phosphorescent OLED construction of FIG. 3.
Figure 22:
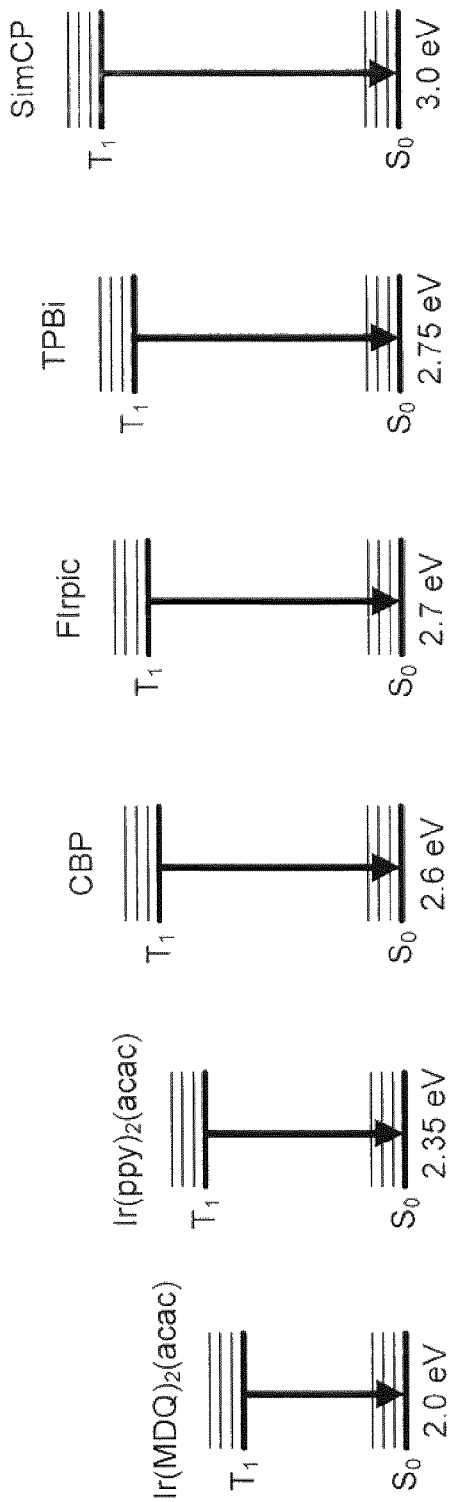
FIG. 22 is an energy level diagram showing the triplet energy gap of each of the organic materials used in the example OLED constructions.

An energy level diagram 400 of the OLED 300 of FIG. 3 is provided in FIG. 4. Similarly to the device shown in FIG. 2, electrons and holes are injected from the cathode 212 and anode 210, respectively, and combine in the Flrpic emitter 404 in the CBP host 402 to form excitons. Excitons in the emitter 404 may transition to a relaxed state and emit a photon, which may then escape the OLED device though the anode. Importantly, the Flrpic blue phosphorescent emitter has a higher triplet energy gap than the CBP host as shown in FIG. 22.

EXAMPLE 4

A similar device to that exemplified in FIG. 3 and FIG. 4 was produced employing the procedures and materials described in Example 3, however, the blue phosphorescent emissive layer of Flrpic was doped into the CBP host at a concentration of 8 wt %, rather than the 20 wt % used in Example 3. FIG. 3 and FIG. 4 may similarly be used to describe the device of Example 4.

The performance of each of OLEDs fabricated according to Examples 1 to 4 was characterized and is shown in FIGS. 5 to 9.

Figure 5:
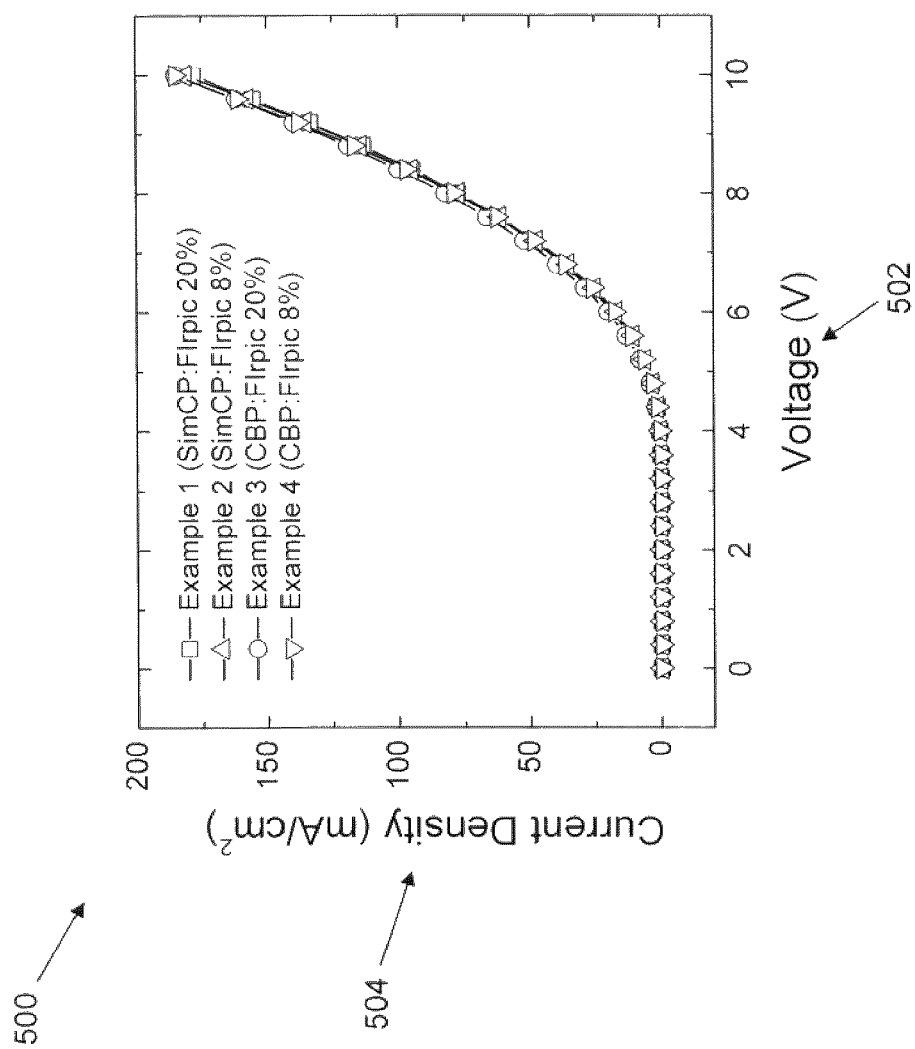
FIG. 5 is a chart showing the relationship between the applied voltage and current density of the example blue phosphorescent OLEDs of FIG. 1 and FIG. 3.

The current-voltage (IV) characteristics of the OLED devices described in Examples 1 to 4 are summarized in FIG. 5. In the IV plot 500, the horizontal axis 502 represents the voltage applied across the device, and the vertical axis 504 represents the measured current density passing through the device. Over the entire measured voltage range the IV characteristics of the devices are nearly identical.

Figure 6:
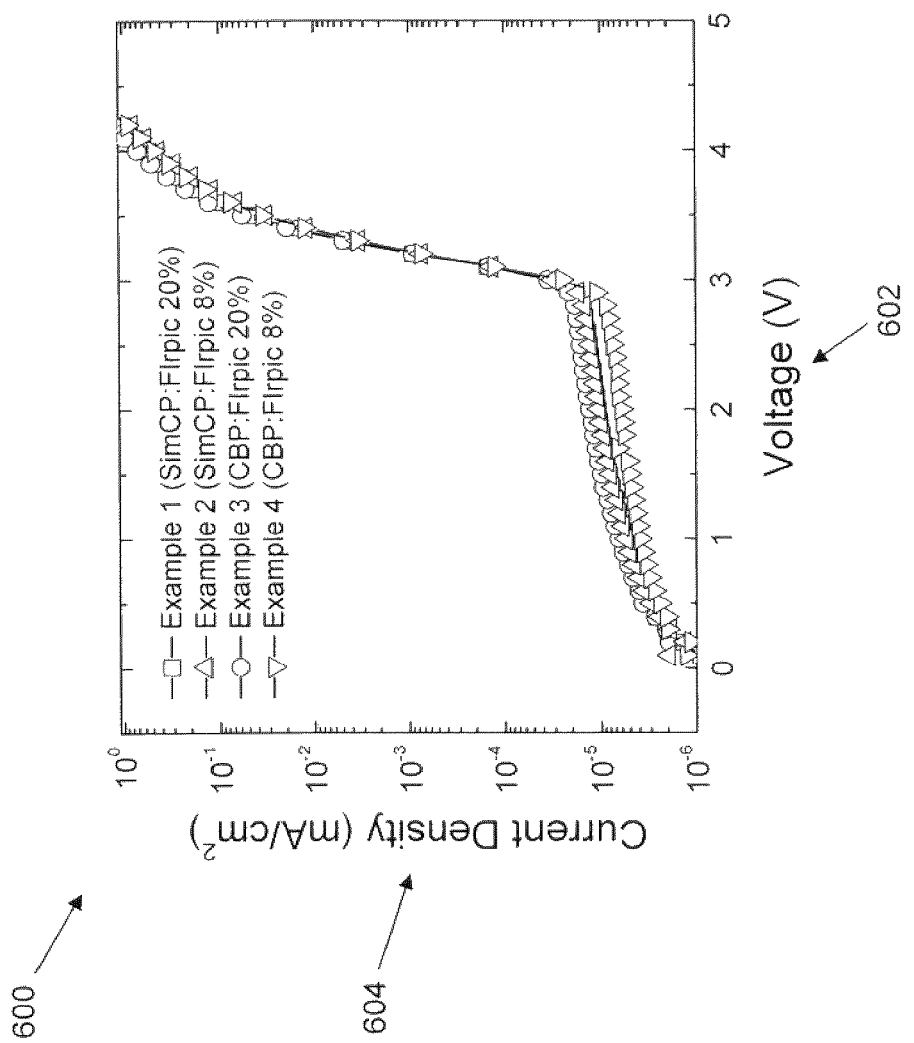
FIG. 6 is a logarithmic chart showing the relationship between applied voltage and current density for the example blue phosphorescent OLEDs of FIG. 1 and FIG. 3.

Plot 600 of FIG. 6, which shows the data of FIG. 5 plotted with a logarithmic current density scale 604 versus voltage 602. The IV characteristics in FIG. 6 are also very similar identical for the different devices, and indicate a threshold voltage of about 3.0 V.

Figure 7:
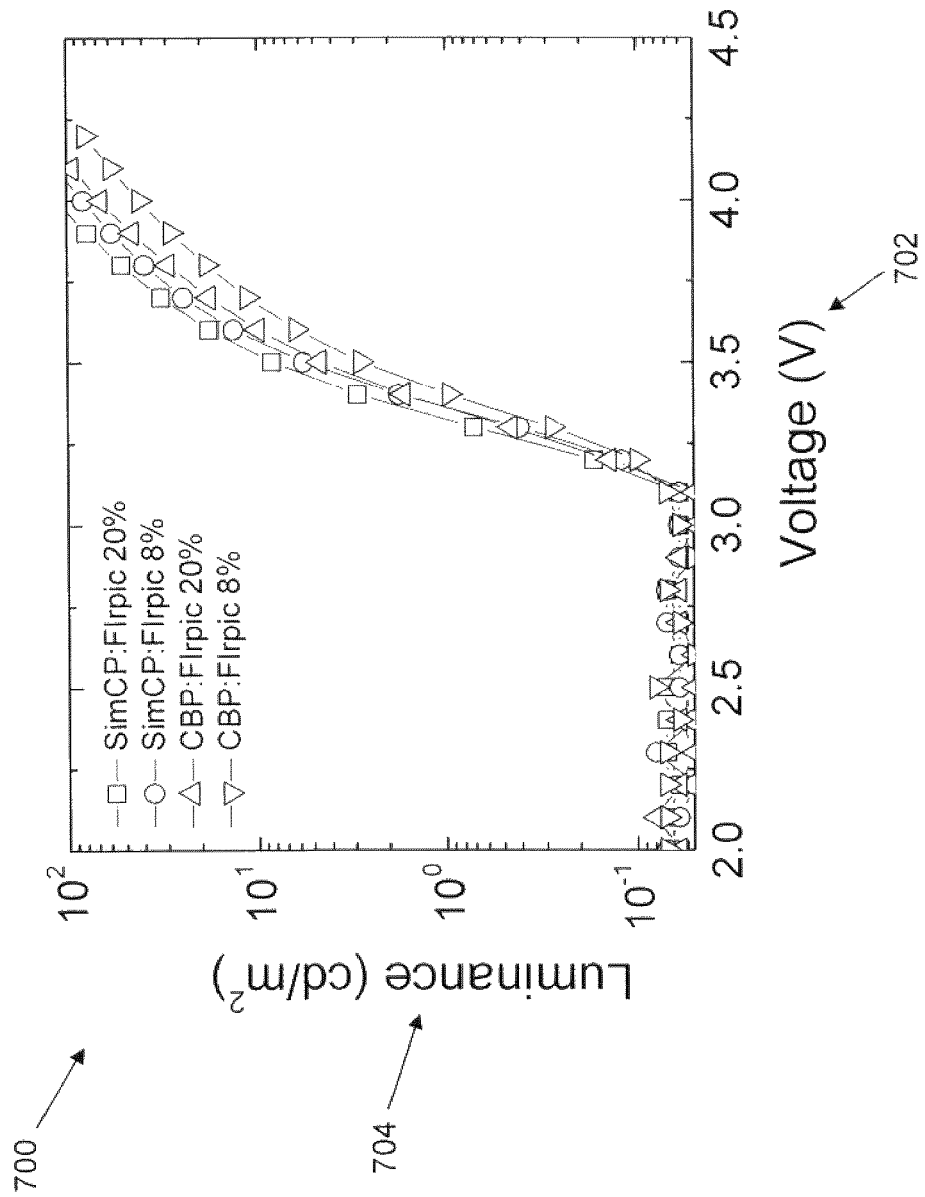
FIG. 7 is a chart showing the relationship between applied voltage and luminance for the example blue phosphorescent OLEDs of FIG. 1 and FIG. 3.

Turning now to FIG. 7, the luminance-voltage (LV) characteristics of the devices are provided in LV plot 700. The horizontal axis 702 represents the voltage applied across the device, and the vertical axis 704 represents the measured luminance of the device. As will be appreciated from FIG. 7, the turn on voltage for electroluminescence is similar across each of the devices at about 3.15 V, which is just above the above-noted threshold voltage of approximately 3.0 V. Above the turn on voltage the device of Example 1 has a higher luminance than the device of Example 3. Similarly, the device of Example 2, with an 8% Flrpic in SimCP emissive layer, has a higher luminance than the device of Example 4, which has an 8% Flrpic in CBP emissive layer. A higher luminance enables a device to emit more light at a given voltage.

Figure 8:
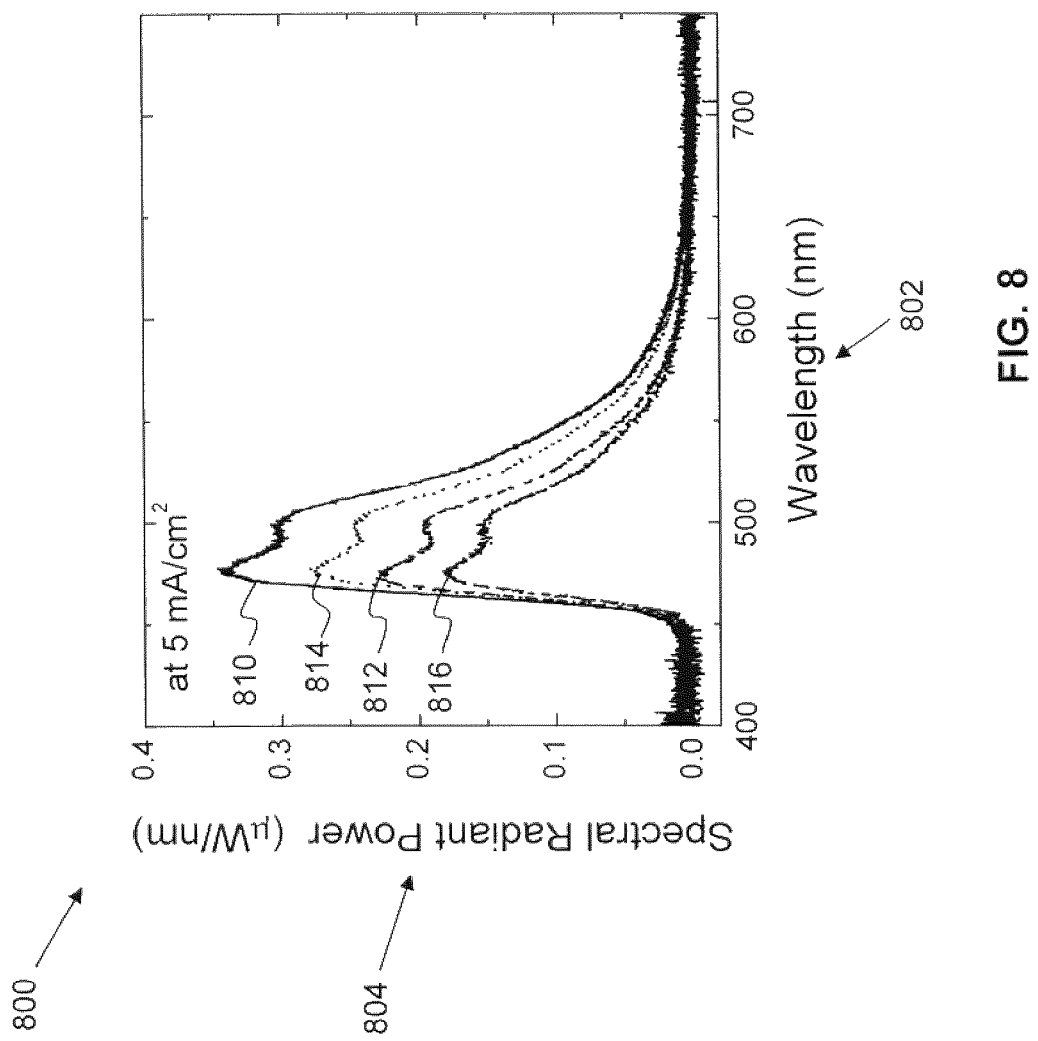
FIG. 8 is a chart showing the relationship between wavelength and spectra radiant power at an applied current density of 5 mA/cm$^2$ for the example blue phosphorescent OLEDs of FIG. 1 and FIG. 3.

The spectral radiant power of the devices at a fixed current density of 5 mA/cm$^2$ is summarized in FIG. 8. The horizontal axis 802 of plot 800 represents the wavelength of the emitted light in nanometers. The vertical axis 804 represents the spectral radiant power in microwatts per nanometer. For a given doping concentration of Flrpic, the spectral radiant power is higher in the 500 nanometer range for the devices with SimCP host than for the devices with CBP host. The device of Example 1, represented by numeral 810, has a doping concentration of 20% Flrpic in SimCP. The device of Example 3, represented by numeral 814, has a doping concentration of 20% Flrpic in CBP. As is shown in FIG. 8, the device of Example 1, 810, has a higher spectral radiant power in the 500 nanometer range than the device of Example 3. Similarly, the device of Example 2, 812, with an 8% Flrpic in SimCP emitter has a higher spectral radiant power in the 500 nanometer range than the device of Example 4, which has an 8% Flrpic in CBP emitter and is represented by 816.

However, because the current density is the same in all of the devices, this data suggests that the quantum efficiency of the devices with SimCP host is higher than for the devices with CBP host. The external quantum efficiency (EQE) 904 for each of the example devices 1 to 4 is given as a function of luminance in the plot 900 of FIG. 9. As expected, the external quantum efficiency of each of the devices comprising a blue phosphorescent emitter doped into the SimCP host is higher than their counterparts comprising a blue phosphorescent emitter doped into a CBP host. Furthermore, the devices with a doping concentration of 20 wt % Flrpic exhibit higher external quantum efficiency than the devices having a doping concentration of only 8 wt %.

As outlined above, SimCP and CBP have similar highest occupied molecular orbitals (HOMOs) and lowest unoccupied molecular orbitals (LUMOs) and similar charge carrier mobilities for electrons and holes. However, the triplet energy gap of SimCP is about 3.0 eV, which is higher than the triplet energy gap of Flrpic, which has a triplet energy gap of 2.7 eV. Conversely, the triplet energy gap of CBP is about 2.6 eV, which is lower than the triplet energy gap of Flrpic.

Figure 9:
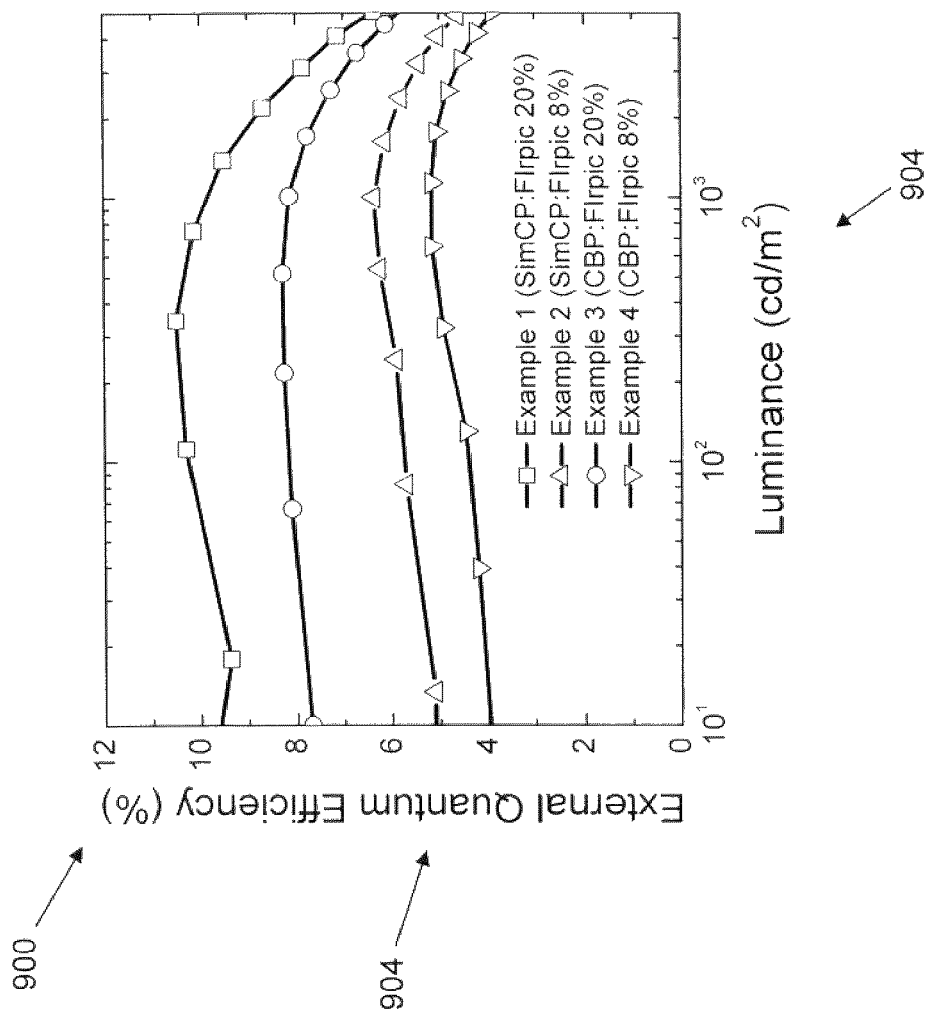
FIG. 9 is a chart showing the relationship between luminance and external quantum efficiency for the example blue phosphorescent OLEDs of FIG. 1 and FIG. 3.

As is evident from the results of FIGS. 4 to 8, and in particular, FIG. 9, CBP is a poor choice for a host material for Flrpic because it does not effectively prevent reverse energy transfer from the emitter back to the host. This is consistent with the teachings of the prior art. The lower triplet energy gap of CBP compared to that of Flrpic therefore explains the device performance data in FIG. 9, which is consistent with similar data available in the prior art.

It has now been realized that a multiple colour emitting OLED device construction comprising at least one emitter with a triplet energy gap greater than the triplet energy gap of the host and another emitter with a triplet energy gap less than the triplet energy gap of the host may be advantageous. In such a device, excitons that were not confined in the emitter with a triplet energy gap greater than that of the host may undergo a transition to the ground state in the emitter with a triplet energy gap that is less than the triplet energy gap of the host. For example, excitons that were not confined to the blue emitter could undergo a transition to the ground state in a green or red emitter.

By way of example, an OLED construction may comprise blue and green phosphorescent emitters having triplet energy gaps of 2.7 eV and 2.35 eV, respectively, doped into a host with a triplet energy gap of 2.6 eV. The blue phosphorescent emitter would have a triplet energy gap greater than the host whereas the green phosphorescent emitter would have a triplet energy gap less than that of the host. In such an example, excitons that were not confined in the blue emitter may migrate to the green emitter, where they may relax to their ground state, thereby emitting a green photon.

Accordingly, example OLED devices have been constructed and characterized according to the examples below.

EXAMPLE 5

Figure 10:
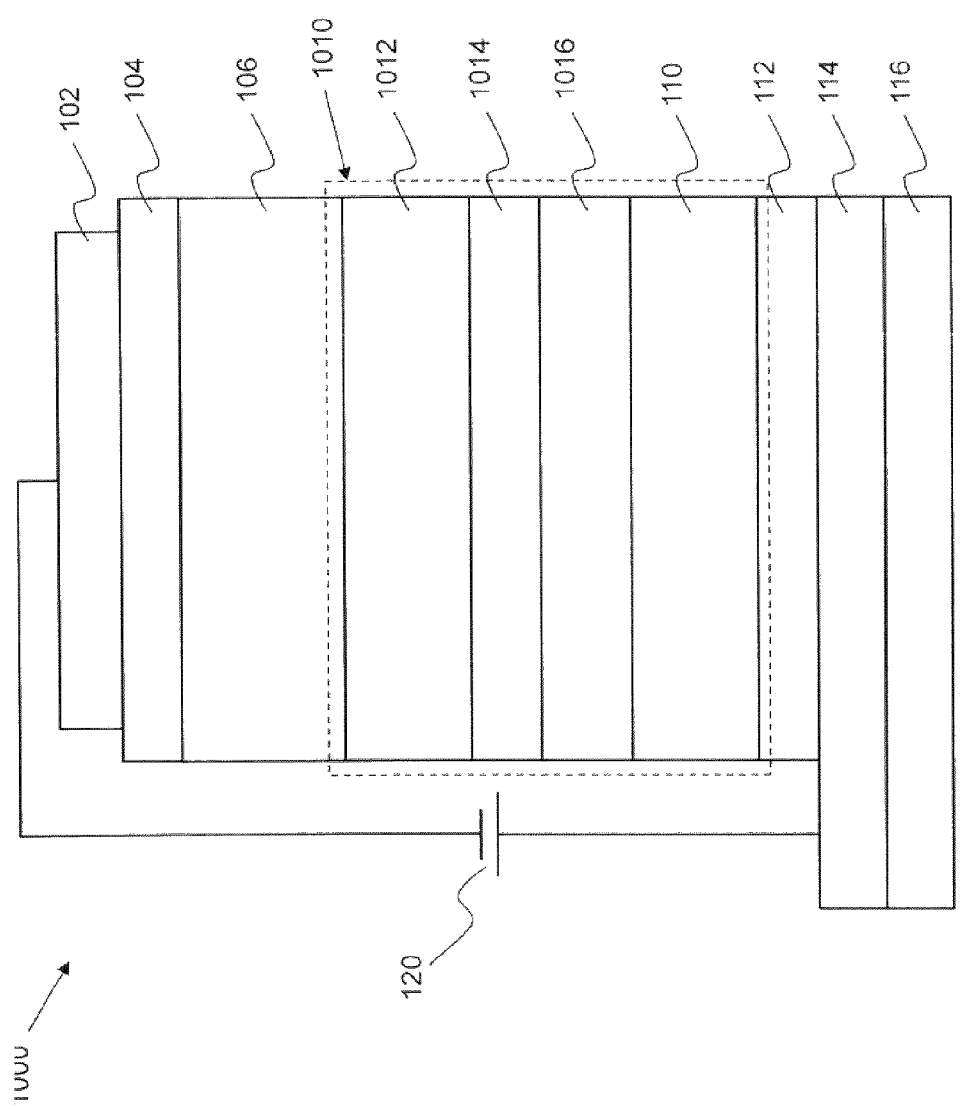
FIG. 10 is a device structure diagram of an example white phosphorescent OLED construction comprising a CBP host.

To illustrate that a multicolour phosphorescent OLED device comprising a blue emitter having a triplet energy gap greater than the triplet energy gap of the host and red and green emitters having a triplet energy gap less than the triplet energy gap of the host may be advantageous, multicolour phosphorescent OLED devices, as exemplified in FIG. 10, were constructed according to the following procedure. A transparent conducting anode of ITO 114 coated on a glass substrate 116 was ultrasonically cleaned with a standard regiment of Alconox™ dissolved in deionized (DI) water, DI water, acetone, and methanol. The ITO anode 114 was then subjected to a UV ozone treatment for 15 minutes in a PL16-110 Photo Surface Processing Chamber (Sen Lights). A 1 nm-thick high work function $MoO_3$ layer 112 was then deposited on the ITO anode 114.

A 35 nm-thick CBP hole transporting layer (HTL) 110 was then deposited on the $MoO_3$ layer 112. A 7.5 nm-thick red emissive layer 1016 comprising CBP co-doped with the phosphorescent red emitter $Ir(MDQ)_2(acac)$ and the phosphorescent green emitter $Ir(ppy)_2(acac)$, each at a concentration of 6 wt %, was deposited on the CBP layer 110. A 2 nm-thick green emissive layer 1014 of CBP doped with the phosphorescent green emitter $Ir(ppy)_2(acac)$ at a concentration of 8 wt % was then deposited on the red emissive CBP layer 1016. A 7.5 nm-thick blue phosphorescent emissive layer 1012 of CBP doped with Flrpic at a concentration of 20 wt % was deposited on the green emissive CBP layer 1014.

A 65 nm-thick TPBi electron transporting layer (ETL) 106 was deposited on the blue phosphorescent emissive layer. A 1 nm-thick LiF layer 104 was deposited on the TPBi layer 106. Finally, a 100 nm-thick Al cathode layer 102 was deposited on the LiF layer. The OLED 100 was driven by a power source 120.

Figure 11:
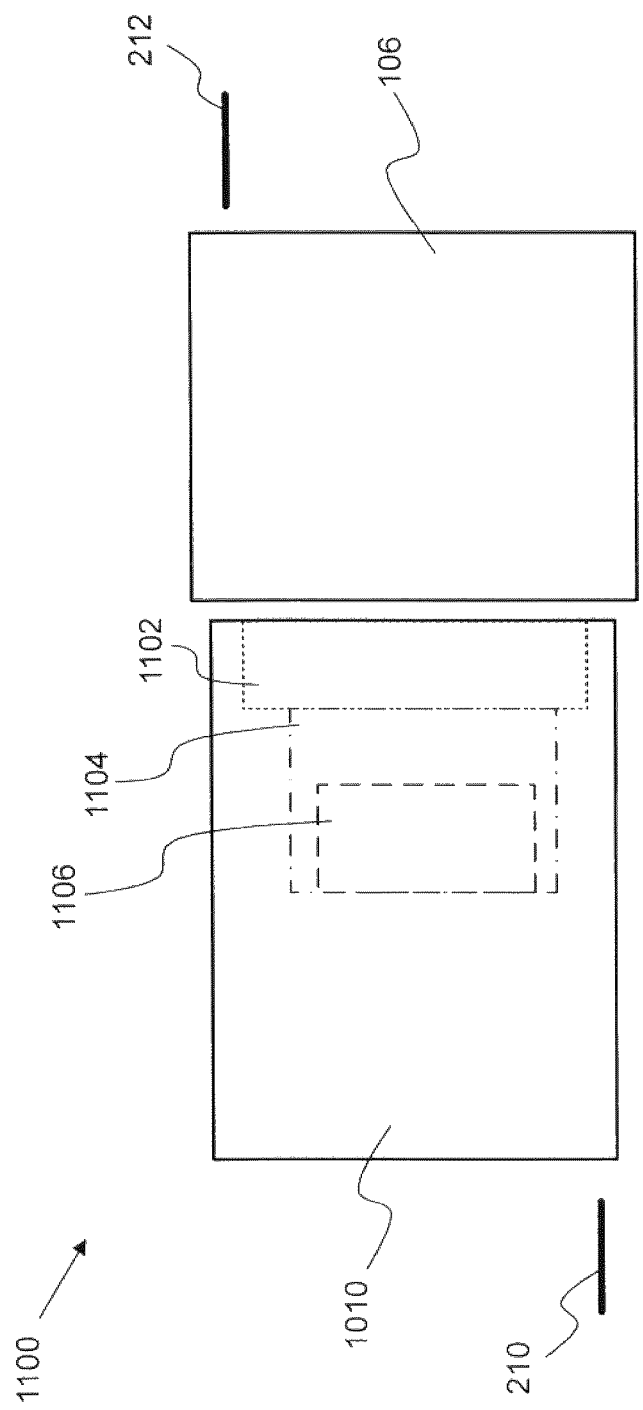
FIG. 11 is an energy level diagram of the example white phosphorescent OLED construction of FIG. 10.

An energy level diagram 1100 of the OLED of FIG. 10 is provided in FIG. 11. FIG. 11 shows the relative positions of the HOMOs and LUMOs with respect to vacuum. Holes are injected from the anode 210 and transported through the CBP layer 1010. Holes and electrons are injected from the anode 210 and the cathode 212, respectively, and may combine in the blue emitter 1102, green emitter 1104 or red emitter 1106 to form an exciton. Excitons in any one of the emitters 1102, 1104, 1106, may radiatively transition to a relaxed state and emit a photon, which may then escape the OLED device though the anode 210.

EXAMPLE 6

A similar device to that exemplified in FIG. 10 and FIG. 11 was produced employing the procedures and materials described in Example 5, however, the blue phosphorescent emissive layer of Flrpic 1012 was doped into the CBP host at a concentration of 8 wt %, rather than the 20 wt % used in Example 5. FIG. 10 and FIG. 11 may similarly be used to describe the device of Example 6.

EXAMPLE 7

Multicoloured phosphorescent OLED devices 100, as exemplified in FIG. 10, were constructed according to the procedure set out in Example 6, however, a SimCP host was used rather than the CBP host of Example 6.

Specifically, a transparent conducting anode of ITO 114 coated on a glass substrate 116 was ultrasonically cleaned with a standard regiment of Alconox™ dissolved in deionized (DI) water, DI water, acetone, and methanol. The ITO anode 114 was then subjected to a UV ozone treatment for 15 minutes in a PL16-110 Photo Surface Processing Chamber (Sen Lights). A 1 nm-thick high work function $MoO_3$ layer 112 was then deposited on the ITO anode 114.

A 35 nm-thick CBP hole transporting layer (HTL) 110 was then deposited on the $MoO_3$ layer 112. A 7.5 nm-thick red emissive layer 1216 comprising SimCP co-doped with the phosphorescent red emitter $Ir(MDQ)_2(acac)$ and the phosphorescent green emitter $Ir(ppy)_2(acac)$, each at a concentration of 6 wt %, was deposited on the CBP layer 110. A 2 nm-thick green emissive layer 1214 of SimCP doped with the phosphorescent green emitter $Ir(ppy)_2(acac)$ at a concentration of 8 wt % was then deposited on the red emissive SimCP layer 1216. A 7.5 nm-thick blue phosphorescent emissive layer 1212 of SimCP doped with Flrpic at a concentration of 20 wt % was deposited on the green emissive SimCP layer 1214.

A 65 nm-thick TPBi electron transporting layer (ETL) 106 was deposited on the blue phosphorescent emissive layer. A 1 nm-thick LiF layer 104 was deposited on the TPBi layer 106. Finally, a 100 nm-thick Al cathode layer 102 was deposited on the LiF layer. The OLED 100 was driven by a power source 120.

Figure 12:
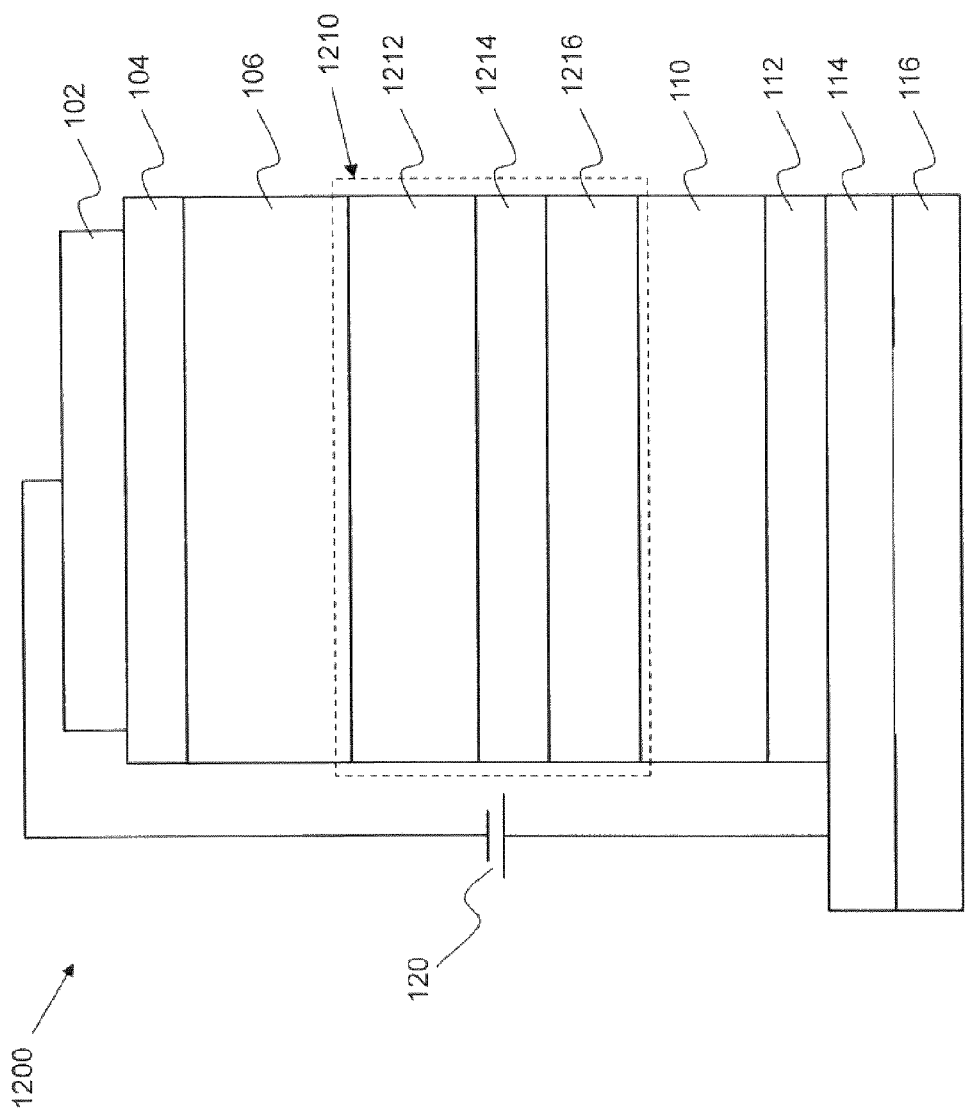
FIG. 12 is a device structure diagram of an example white phosphorescent OLED construction comprising a SimCP host.
Figure 13:
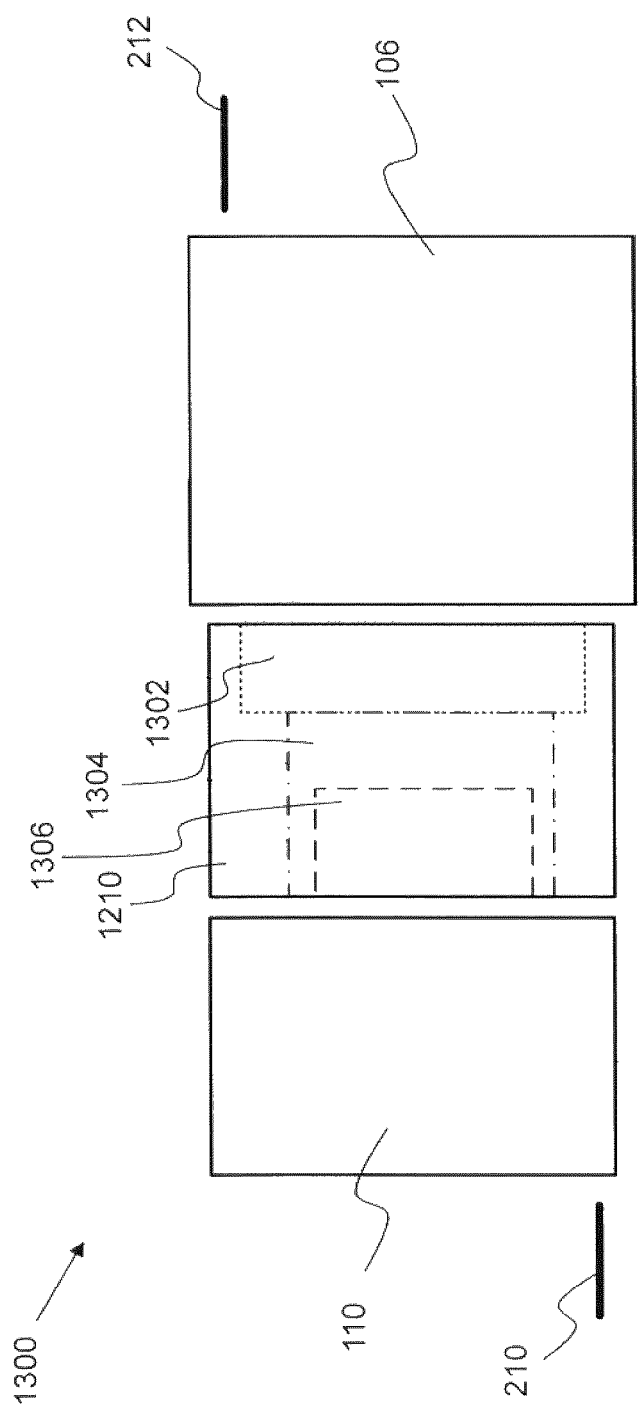
FIG. 13 is an energy level diagram of an example white phosphorescent OLED construction of FIG. 12.

An energy level diagram 1300 of the OLED of FIG. 12 is provided in FIG. 13. Holes are injected from the anode 210 and transported through the CBP layer 110. Holes and electrons are injected from the anode 210 and the cathode 212, respectively, and may combine in the blue emitter 1302, green emitter 1304 or red emitter 1306 to form an exciton. Excitons in any of the emitters 1302, 1304, 1306, may transition to a relaxed state and emit a photon of an energy corresponding to the triplet energy gap of the emitter in which the exciton transitioned to the relaxed state. The photon may then escape the OLED device though the anode 210.

EXAMPLE 8

A similar device to that exemplified in FIG. 12 and FIG. 13 was produced employing the procedures and materials described in Example 5, however, the blue phosphorescent emissive layer of Flrpic 1212 was doped into the SimCP host at a concentration of 8 wt %, rather than the 20 wt % used in Example 7. FIG. 12 and FIG. 13 may similarly be used to describe the device of Example 8.

Figure 14:
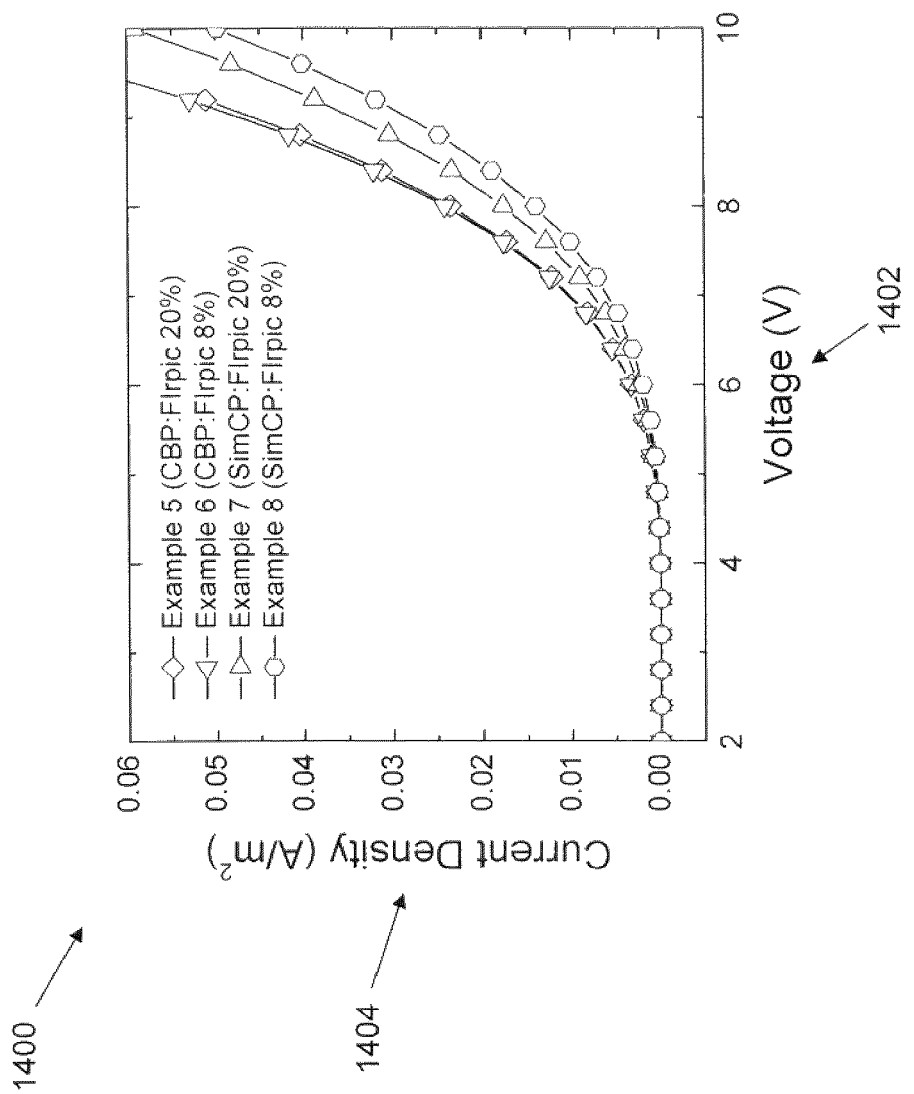
FIG. 14 is a chart showing the relationship between applied voltage and current density of the example blue phosphorescent OLEDs of FIG. 10 and FIG. 12.

The IV characteristics of the devices described in Example 5, Example 6, Example 7, and Example 8 are summarized in FIG. 14. The horizontal axis 1402 represents the voltage applied across the device, whereas the vertical axis 1404 represents the measured current density passing through the device. Although the IV characteristics of the devices appear similar, it is observed that a slightly higher driving voltage is required from the devices comprising a SimCP host to achieve a current density equivalent to their counterparts comprising a CBP host. Although the 20% concentration of the blue emitter in Example 7 appears to exhibit a higher current density at a given voltage than the blue emitter at 8% concentration in the SimCP host of Example 8, both the devices fabricated according to Examples 5 and 6 achieved a higher current density at a given voltage.

Figure 15:
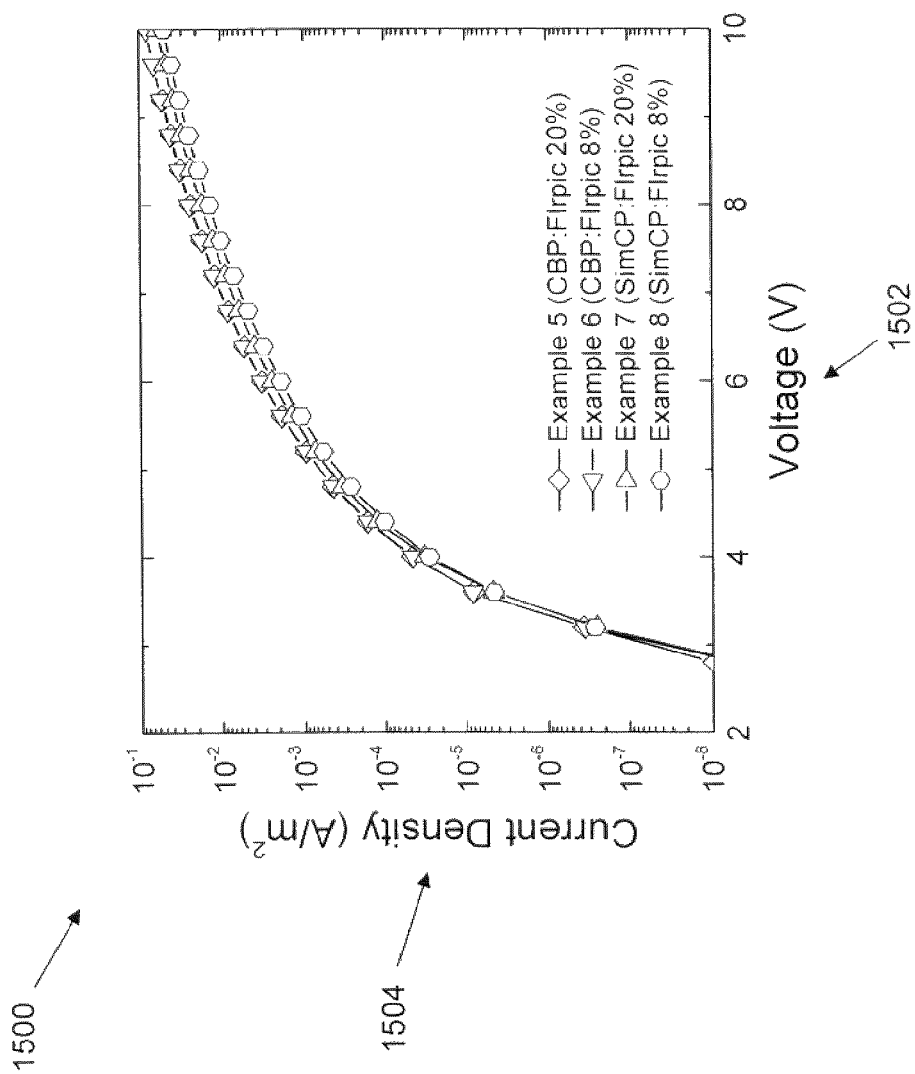
FIG. 15 is a chart showing the relationship between applied voltage and current density of the example blue phosphorescent OLEDs of FIG. 10 and FIG. 12.

Referring now to FIG. 15, which is a voltage vs. current density plot 1500 similar to FIG. 14 presented with a logarithmic current density scale on the vertical axis 1504. The IV characteristics at lower voltages are nearly identical for the different devices. As is shown in FIG. 15, the data indicate a threshold voltage of about 2.8 V, which is slightly lower than that of the blue OLED devices discussed above in Examples 1 to 4.

Figure 16:
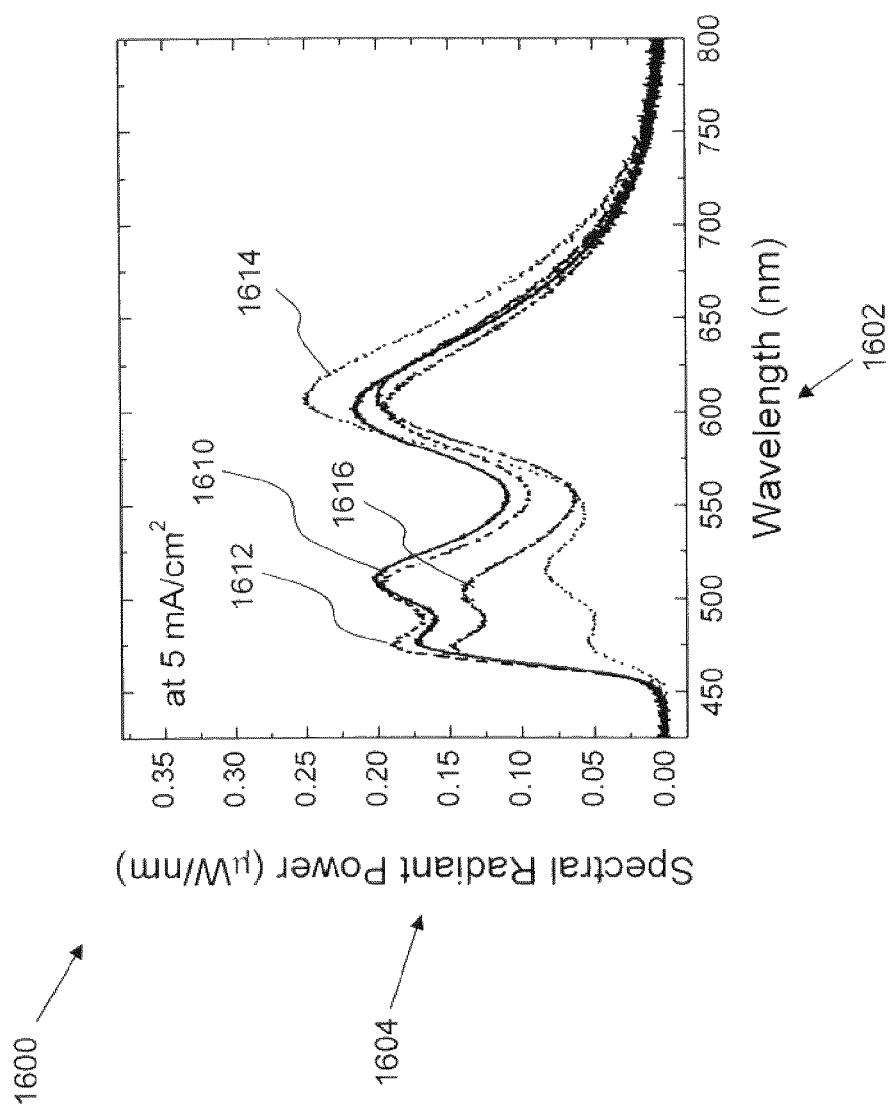
FIG. 16 is a chart showing the relationship between wavelength and spectra radiant power at an applied current density of 5 mA/cm$^2$ of the example white phosphorescent OLEDs of FIG. 10 and FIG. 12.

The spectral radiant power of the devices at a fixed current density of 5 mA/cm² is summarized in the plot 1600 of FIG. 16. Surprisingly, the electroluminescence from Flrpic peak at about 475 nm is stronger in the multicolour devices with the CBP host (Examples 5 and 6, represented by numerals 1610 and 1612, respectively) than for the devices with SimCP host (Examples 7 and 8, represented by numerals 1614 and 1616, respectively). This result is despite the fact that CBP has a lower triplet energy gap than Flrpic and SimCP has a higher triplet energy gap than Flrpic.

Generally accepted design rules and prior experiments show that the triplet energy gap of the host must be higher than the triplet energy gap of the dopant for efficient phosphorescence, particularly for high triplet energy gap phosphorescent emitters, such as blue phosphorescent emitters. Despite this, the proposed OLED devices described herein, having hosts with triplet energy gaps lower than at least one of the emitters but higher than another of the emitters, may exhibit satisfactory device performance. In some cases, the performance of the proposed OLED devices may be significantly better than their counterparts comprising hosts with triplet energy gaps greater than all of the emitters doped therein.

Figure 17:
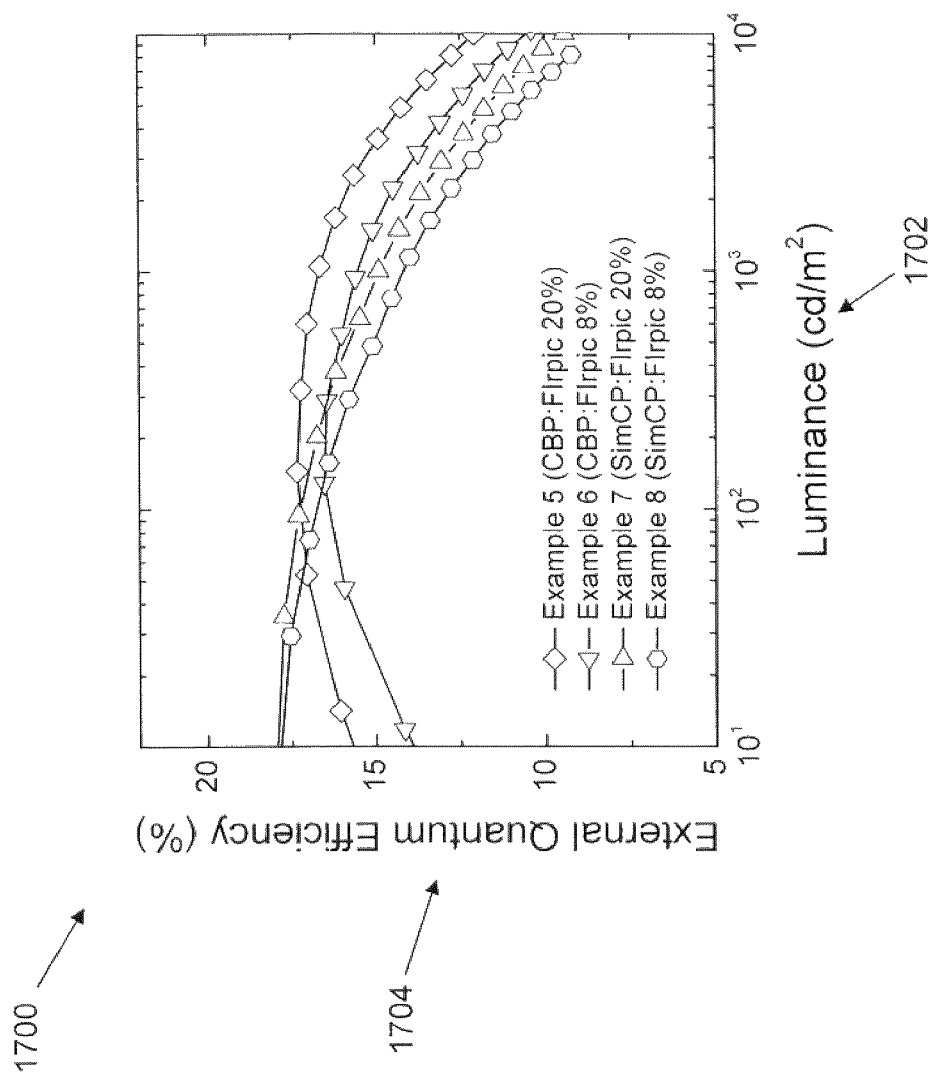
FIG. 17 is a chart showing the relationship between luminance and external quantum efficiency of the example white phosphorescent OLEDs of FIG. 10 and FIG. 12.

The external quantum efficiency of the devices as a function of current density is summarized in the plot 1700 of FIG. 17. In plot 1700, the external quantum efficiency (EQE) 1704 is expressed as a function of the luminance 1702. Consistent with the spectral radiant power results presented in FIG. 16, the EQE of the multicolour devices with the CBP host (Examples 5 and 6) is higher above by approximately 100 candela per square meter than for the devices with SimCP host (Examples 7 and 8). Devices having a higher efficiency have lower power requirements. As such, a mobile device using a more efficient OLED would require a smaller battery or may have a longer battery life, given a predetermined battery capacity.

Figure 18:
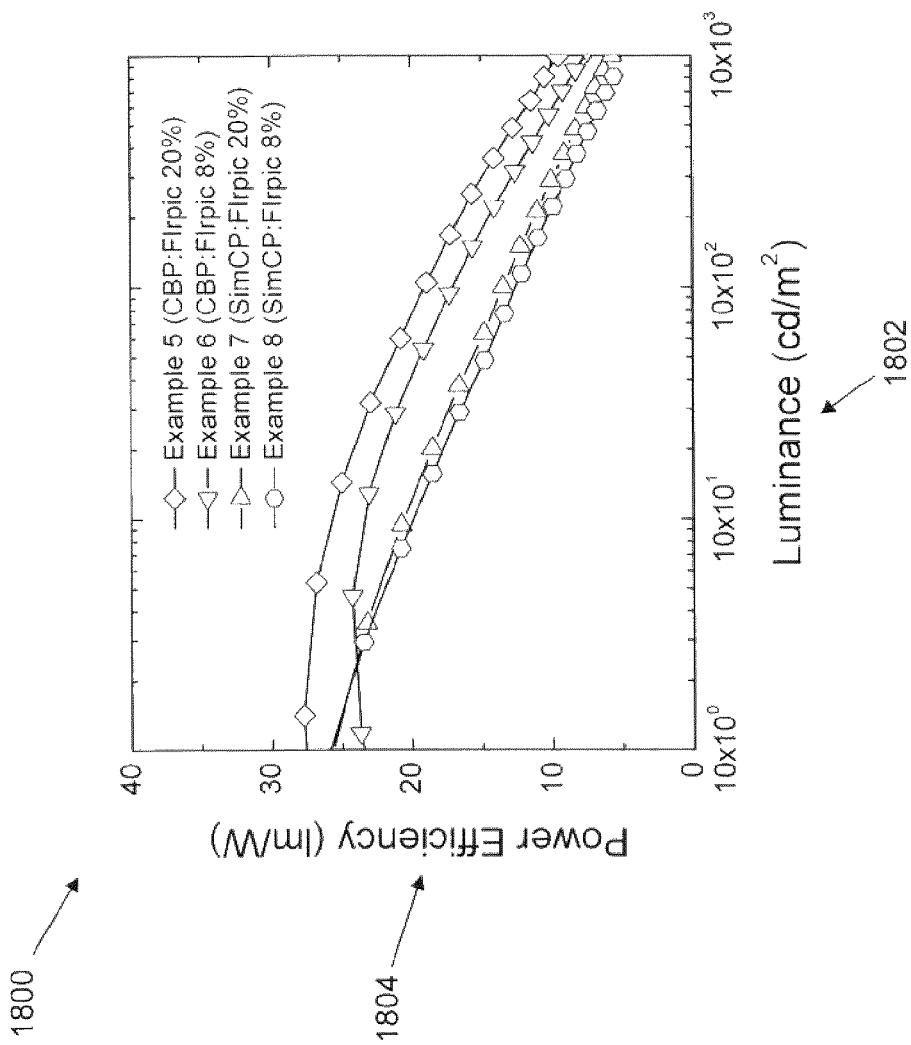
FIG. 18 is a chart showing the relationship between luminance and power efficiency of the example white phosphorescent OLEDs of FIG. 10 and FIG. 12.

FIG. 18 is a plot 1800 of the power efficiency 1804 expressed in lumens per watt versus luminance 1802 in candela per square meter. As is evident from the plot 1800, the power efficiency of the multicolour devices with the CBP host (Examples 5 and 6) is generally higher than for the devices with SimCP host (Examples 7 and 8) across a wide range of luminances. This is advantageous for practical applications, as this result suggests that OLED devices comprising a host having a triplet energy gap between that of the highest energy gap emitter and the lowest energy gap emitter in the OLED may be more efficient across a range of brightnesses. OLEDs are often used in mobile electronic devices. A more efficient OLED may have a longer battery life and/or require a smaller battery or other power source in the mobile electronic device to generate a given luminosity. For example, a rechargeable flashlight comprising a higher efficiency OLED may last longer between charges. A more efficient OLED may also have a longer lifetime, as a lower power is required to generate a given luminosity.

What is more, the electroluminescence spectrum of the device fabricated according to Example 5 and comprising a CBP host was found to be very stable as a function of luminance. A stable electroluminescence spectrum is advantageous to ensure that the emission colour of the device is not dependent of the luminance of the device. An emission colour that depends on luminance may cause a device to change colour as the brightness of the OLED is adjusted.

Figure 19:
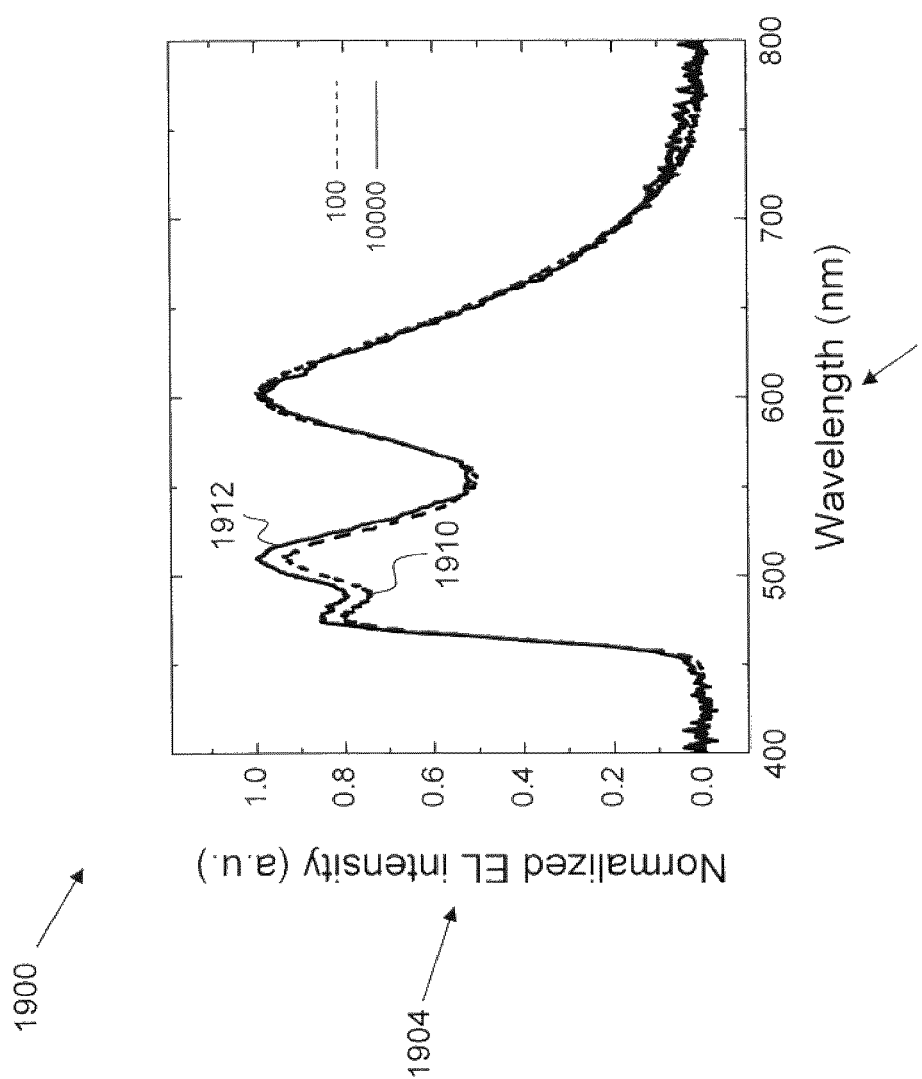
FIG. 19 is a chart showing the relationship between wavelength and normalized EL intensity of the example white phosphorescent OLEDs of FIG. 10 at a luminance of 100 cd/m$^2$ and 10,000 cd/m$^2$.

Normalized electroluminescent intensity 1904 versus wavelength 1902 plot 1900 of FIG. 19 shows the electroluminescence spectrum of a device fabricated according to Example 5 operating at two distinct luminances. The device is being operated at a low luminance 1912 of 100 cd/m$^2$ and at a high luminance 1910 of 10 000 cd/m$^2$. As will be apparent, the electroluminescence spectrum at each of these luminances is similar, despite a slight difference in the region of 500 nm.

FIGS. 14 to 19 demonstrate that in multicolour (i.e., multi-emitter) OLEDs the triplet energy gap of the host does not have to be higher than the triplet energy gap of the dopants to achieve acceptable performance. Indeed, the peak EQE and power efficiency of devices from Example 5 reached 17.3% and 27.7 lm/W respectively, comparable to state of the art multicolour white OLEDs in the prior art.

Figure 20:
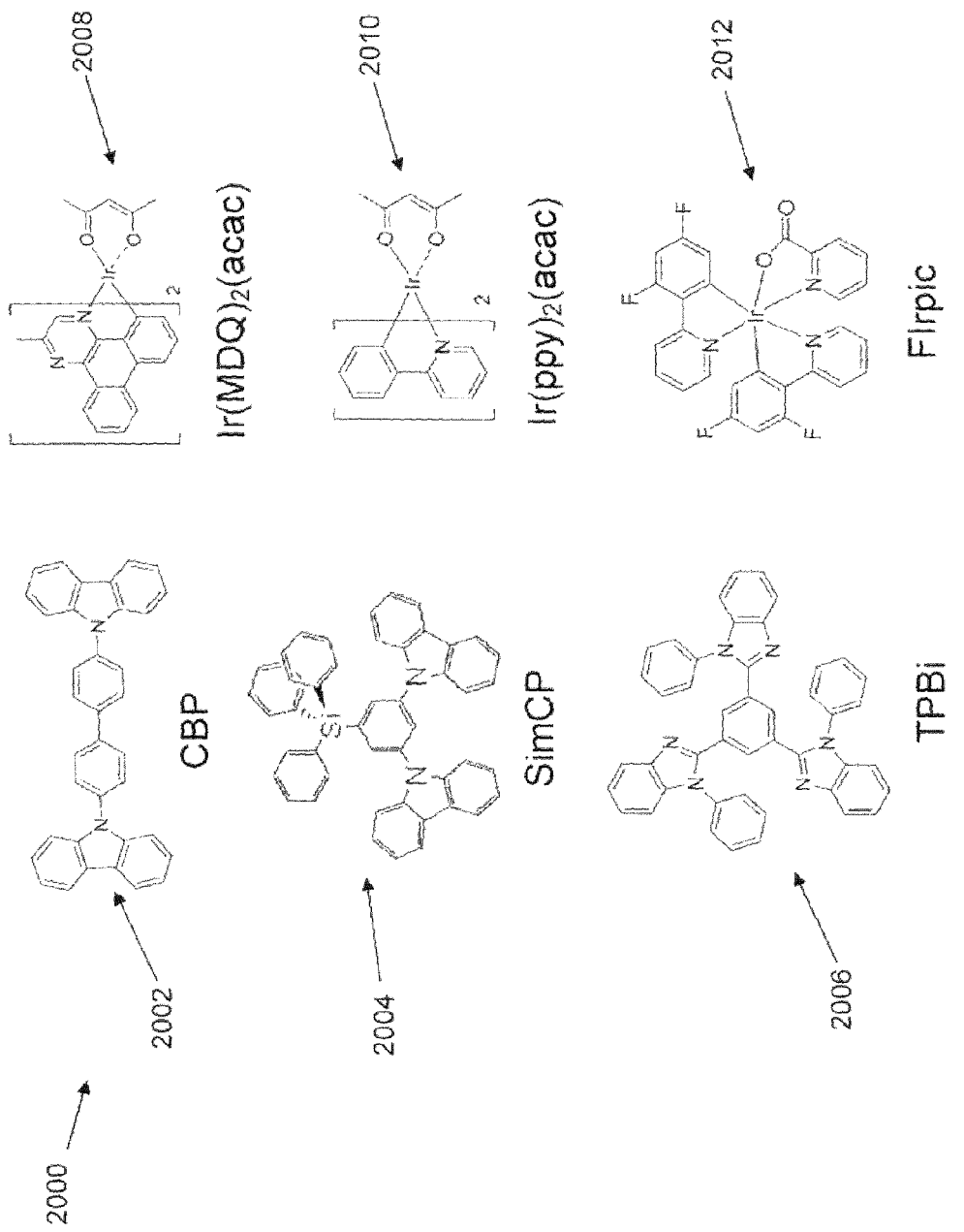
FIG. 20 is a diagram of the molecular structure of each of the organic materials used in the example OLED constructions.

The molecular structure of the various materials used in the examples is summarized in FIG. 20. Other possible host candidates and/or host/emitter combinations that may be used have been discussed in the literature. For example, L. Xiao et al., in Adv. Mater. 23, 926 (2011), and U.S. Pat. No. 8,105,701.

Figure 21:
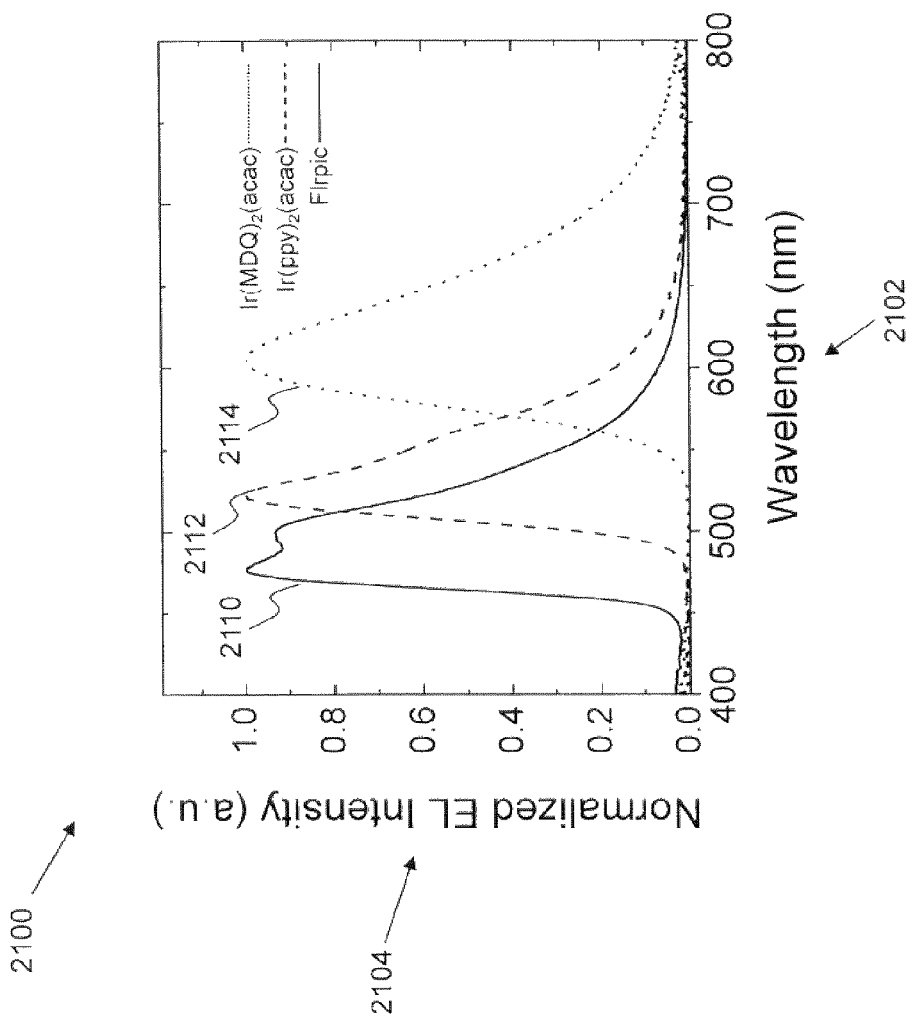
FIG. 21 is a chart showing the relationship between wavelength and normalized EL intensity of red, green and blue emission from Ir(MDQ)$_2$(acac), Ir(ppy)$_2$(acac) and FIrpic monochrome OLEDs respectively.

The electroluminescence (EL) spectrum of Flrpic, Ir(ppy)$_2$(acac), and Ir(MDQ)$_2$(acac) are shown in FIG. 21. The triplet energy gap of each of the host and emitter materials used in the examples is provided in FIG. 22.

Non-limiting general example embodiments will now be described, including example aspects of such embodiments.

In a general embodiment, a multiple emitter organic light emitting diode (OLED) includes a host having a triplet energy gap, at least one emitter doped into the host having a triplet energy gap greater than the triplet energy gap of the host, and at least one other emitter doped into the host having a triplet energy gap less than the triplet energy gap of the host.

In an aspect, the OLED further includes at least one additional other emitter doped into the host having a triplet energy gap less than the triplet energy gap of the host.

In another aspect, the OLED further includes at least one additional other emitter doped into the host having a triplet energy gap greater than the triplet energy gap of the host.

In another aspect, at least one of the emitters emits substantially blue light.

In a further aspect, the blue emitter emits at substantially 2.7 eV.

In a further aspect, the blue emitter is Flrpic.

In another aspect, at least one of the emitters emits substantially red light.

In a further aspect, the red emitter emits at substantially 2.0 eV.

In a further aspect, the red emitter is Ir(MDQ)$_2$(acac).

In another aspect, at least one of the emitters emits substantially green light.

In a further aspect, the green emitter emits at substantially 2.35 eV.

In a further aspect, the green emitter is Ir(ppy)$_2$(acac).

In another aspect, the host material has a triplet energy gap that is between about 0 eV and 0.3 eV lower than the triplet energy gap of the highest triplet energy gap emitter.

In another aspect, the OLED further includes at least one additional other emitter doped into the host having a triplet energy gap greater than the triplet energy gap of the host.

In another aspect, the OLED is a white OLED.

In another general embodiment, a method is provided for producing a multiple emitter organic light emitting diode (OLED), the method including doping an emitter into a host, the emitter having a triplet energy gap greater than a triplet energy gap of the host, and doping an other emitter into the host, the other emitter having a triplet energy gap less than the triplet energy gap of the host.

In another general embodiment, an OLED with multiple phosphorescent emitters is provided wherein the host material has a triplet energy gap lower than the triplet energy gap of one or more of the phosphorescent emitters but higher than at least one of the other phosphorescent emitters.

In another general embodiment, there is provided a method of constructing a phosphorescent OLED with multiple phosphorescent emitters where the triplet energy gap of the host material is lower than that of one or more of the phosphorescent emitters doped into the host but higher than at least one of the other phosphorescent emitters.

In another general embodiment, there is provided a method of constructing a white phosphorescent OLED with multiple phosphorescent emitters where the triplet energy gap of the host material is lower than that of one or more of the phosphorescent emitters, for example lower than that of the blue emitter but higher than at least one of the other phosphorescent emitters, for example, the red emitter.

It can be appreciated that potential applications of organic electroluminescent devices satisfying the conditions of the principles described herein include any display or light application or a consumer electronic device. It will also be appreciated that although the above examples are given in the context of a single host, two or more hosts may be used in an OLED. For example, a blue emitter may be doped into a first host and a red emitter may be doped into a second host, provided that the hosts have a triplet energy gap that is between that of the highest triplet energy gap emitter and the lowest triplet energy gap emitter.

Although the above has been described with reference to certain specific example embodiments, various modifications thereof will be apparent to those skilled in the art without departing from the scope of the claims appended hereto.

The invention claimed is:

1. A multiple emitter organic light emitting diode (OLED) comprising:
    a host having a triplet energy gap;
    at least one emitter doped into the host having a triplet energy gap greater than the triplet energy gap of the host;
    at least one other emitter doped into the host having a triplet energy gap less than the triplet energy gap of the host; and
    at least one additional other emitter doped into the host having a triplet energy gap greater than the triplet energy gap of the host.

2. The OLED of claim 1 further comprising at least one additional other emitter doped into the host having a triplet energy gap less than the triplet energy gap of the host.

3. The OLED of claim 1 wherein the host material has a triplet energy gap that is between about 0 eV and 0.3 eV lower than the triplet energy gap of the highest triplet energy gap emitter.

4. The OLED of claim 1 wherein the OLED is a white OLED.

5. The OLED of claim 1 wherein at least one of the emitters emits substantially blue light.

6. The OLED according to claim 5 wherein the blue emitter emits at substantially 2.7 eV.

7. The OLED of claim 6 wherein the blue emitter is Flrpic.

8. The OLED of claim 1 wherein at least one of the emitters emits substantially red light.

9. The OLED of claim 8 wherein the red emitter emits at substantially 2.0 eV.

10. The OLED of claim 9 wherein the red emitter is $Ir(MDQ)_2(acac)$.

11. The OLED of claim 1 wherein at least one of the emitters emits substantially green light.

12. The OLED of claim 11 wherein the green emitter emits at substantially 2.35 eV.

13. The OLED of claim 12 wherein the green emitter is $Ir(ppy)_2(acac)$.

14. A method for producing a multiple emitter organic light emitting diode (OLED), the method comprising:
    doping an emitter into a host, the emitter having a triplet energy gap greater than a triplet energy gap of the host;
    doping at least one other emitter into the host, the at least one other emitter having a triplet energy gap less than the triplet energy gap of the host; and
    doping at least one additional other emitter into the host, the at least one additional other emitter having a triplet energy gap greater than the triplet energy gap of the host.

15. The method of claim 14, further comprising:
    doping at least one additional other emitter into the host, the at least one additional other emitter having a triplet energy gap less than the triplet energy gap of the host.

16. The method of claim 14, wherein at least one of the emitters emits substantially blue light.

17. The method of claim 14, wherein at least one of the emitters emits substantially red light.

18. The method of claim 14, wherein at least one of the emitters emits substantially green light.

19. A multiple emitter organic light emitting diode comprising:
    an anode and a cathode; and
    a host disposed between the anode and the cathode, the host further comprising:
        a first host region doped with a first emitter having a triplet energy gap greater than the triplet energy gap of the host, the first host region being disposed proximal to the cathode;
        a second host region doped with a second emitter having a triplet energy gap less than the triplet energy gap of the host, the second host region being disposed proximal to the anode; and
        a third host region doped with a third emitter having a triplet energy gap less than the triplet energy gap of the host and greater than the triplet energy gap of the second emitter, the third host region being disposed between the first host region and the second host region.

20. The multiple emitter organic light emitting diode according to claim 19, wherein the first emitter is a blue emitter, the second emitter is a red emitter, and the third emitter is a green emitter.

* * * * *